(12) United States Patent
Tchakarov et al.

(10) Patent No.: US 8,395,319 B2
(45) Date of Patent: Mar. 12, 2013

(54) ENCAPSULATED LIGHT-EMMITTING DEVICE

(75) Inventors: Svetoslav Tchakarov, Arcueil (FR); Didier Jousse, Taverny (FR)

(73) Assignee: Saint-Gobain Glass France, Courbevoie (FR)

( * ) Notice: Subject to any disclaimer, the term of this patent is extended or adjusted under 35 U.S.C. 154(b) by 62 days.

(21) Appl. No.: 12/375,217

(22) PCT Filed: Jul. 20, 2007

(86) PCT No.: PCT/FR2007/051697
§ 371 (c)(1),
(2), (4) Date: Apr. 7, 2009

(87) PCT Pub. No.: WO2008/012460
PCT Pub. Date: Jan. 31, 2008

(65) Prior Publication Data
US 2009/0302760 A1    Dec. 10, 2009

(30) Foreign Application Priority Data
Jul. 28, 2006    (FR) ..................................... 06 53172

(51) Int. Cl.
*H01J 1/88* (2006.01)
(52) U.S. Cl. .......... 313/512; 313/504; 313/507; 445/24; 445/25
(58) Field of Classification Search .......... 313/498–512; 315/169.3, 169.1; 445/24–25
See application file for complete search history.

(56) References Cited

U.S. PATENT DOCUMENTS

| 5,189,405 | A | 2/1993 | Yamashita et al. | |
|---|---|---|---|---|
| 2002/0068191 | A1 | 6/2002 | Kobayashi | |
| 2002/0113548 | A1 | 8/2002 | Silvernail | |
| 2003/0143423 | A1* | 7/2003 | McCormick et al. | 428/690 |
| 2004/0120155 | A1 | 6/2004 | Suenaga | |
| 2004/0263761 | A1* | 12/2004 | Tannas, Jr. | 349/153 |
| 2005/0062402 | A1* | 3/2005 | Wachi et al. | 313/495 |
| 2005/0255325 | A1* | 11/2005 | Inagaki | 428/447 |
| 2006/0087224 | A1* | 4/2006 | Oki et al. | 313/504 |

FOREIGN PATENT DOCUMENTS

| JP | 63-83797 A | 6/1988 |
|---|---|---|
| JP | 03-192688 A | 8/1991 |

(Continued)

OTHER PUBLICATIONS

Office Action issued Dec. 20, 2011 in Japanese Patent Application No. 2009-521309, (English Translation only).

*Primary Examiner* — Tracie Y Green
(74) *Attorney, Agent, or Firm* — Oblon, Spivak, McClelland, Maier & Neustadt, L.L.P.

(57) ABSTRACT

An encapsulated light-emitting device including a light-emitting system including an electroluminescent active layer positioned on a protective substrate and between two electrodes, a protective cover for the electroluminescent layer, attached to the substrate, a sealant sealing against liquid water and water vapor, a surround over the circumference of the device, made of at least one metal part or made of at least one plastic or glass part having a metal portion, the metal part or metal portion being used at least for a first electrical connection to one of the electrodes, or including at least one electroconductive layer deposited over one of the edges of the side of the substrate or of the cover and jutting out, between the surround and the substrate or the cover, for a first electrical connection to one of the electrodes.

21 Claims, 9 Drawing Sheets

FOREIGN PATENT DOCUMENTS

Figure 2A:
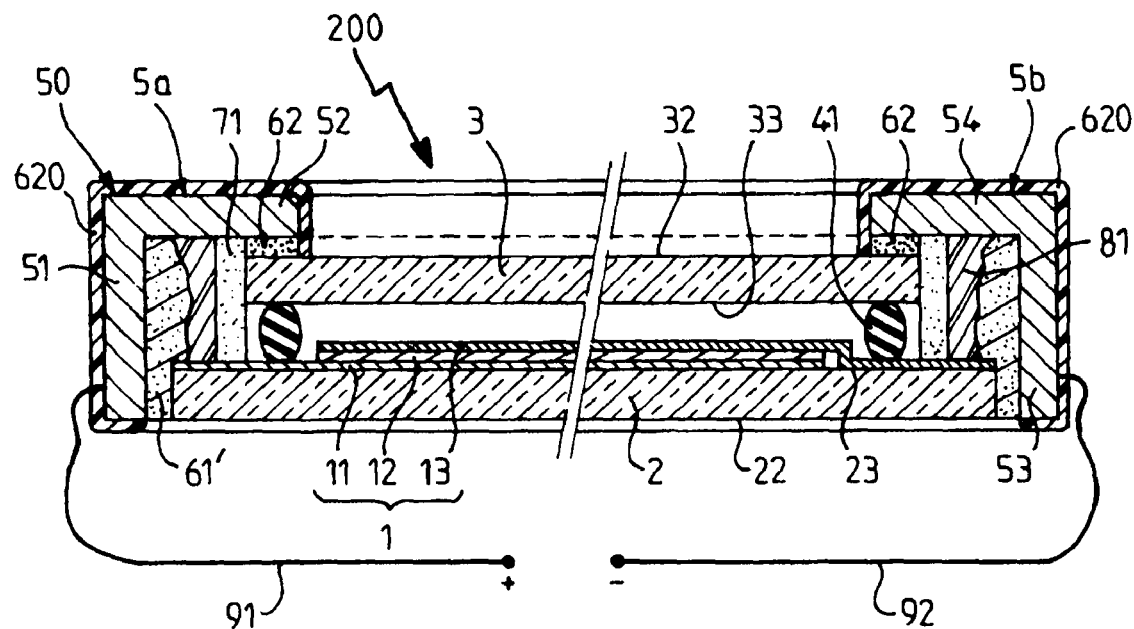

| | | |
|---|---|---|
| JP | 11-067446 A | 3/1999 |
| JP | 11-219782 A | 8/1999 |
| JP | 2000-156170 A | 6/2000 |
| JP | 2001-093661 A | 4/2001 |
| JP | 2002-093573 A | 3/2002 |
| JP | 2002-175877 A | 6/2002 |
| JP | 2003-317938 A | 11/2003 |
| JP | 2003-317940 A | 11/2003 |
| JP | 2004-079292 A | 3/2004 |
| WO | WO 00/58234 A1 | 5/2000 |
| WO | 02 067342 | 8/2002 |
| WO | WO 2005/057986 A1 | 6/2005 |

* cited by examiner

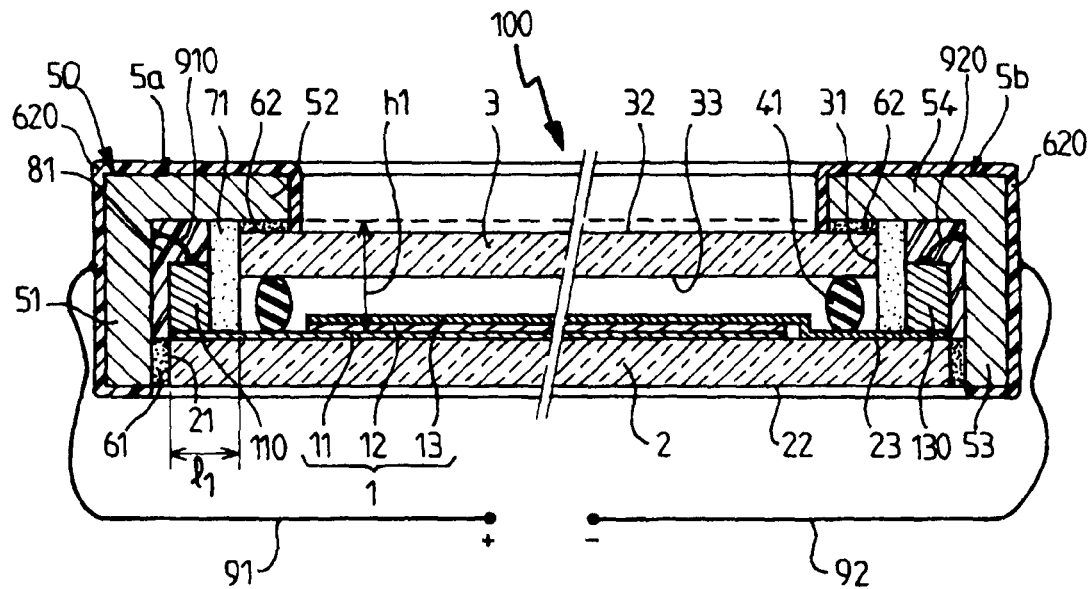
FIG.1a
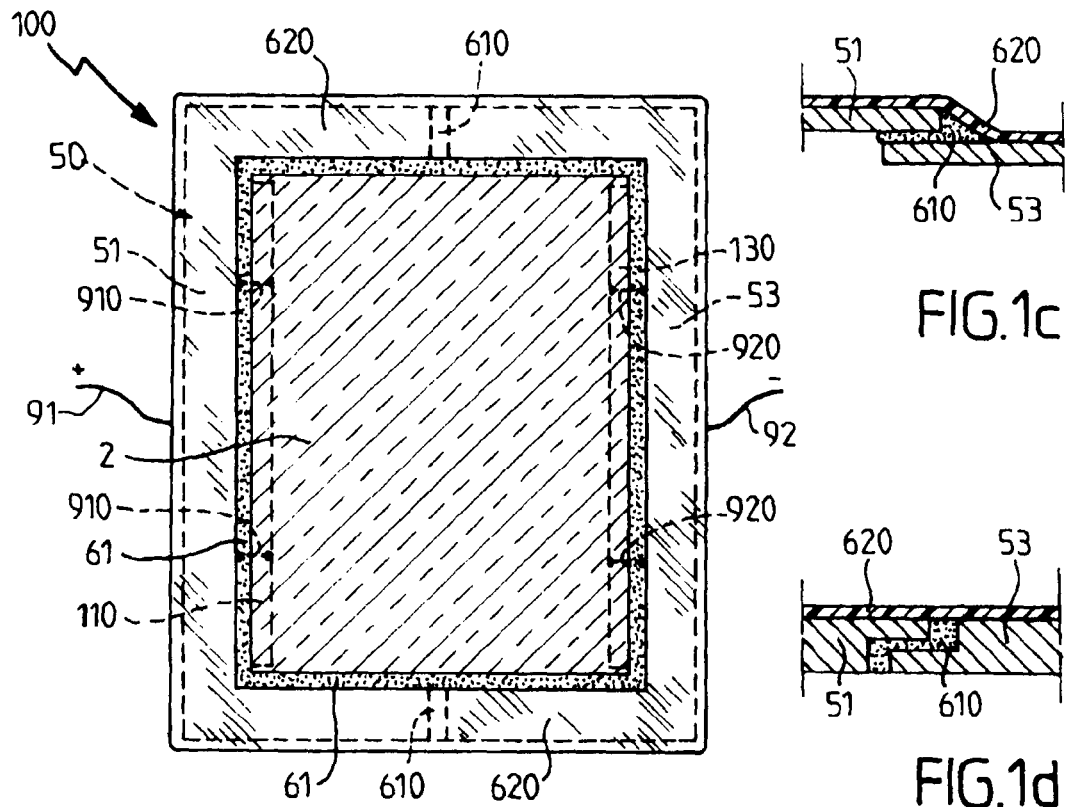
FIG.1c
FIG.1d
FIG.1b

ENCAPSULATED LIGHT-EMMITTING DEVICE

The invention relates to an encapsulated light-emitting device.

In a known manner, organic emitting devices (OEDs) in particular light-emitting diodes based on an organic electroluminescent layer (OLEDs for "organic light-emitting diodes") are electronic components that are very sensitive to oxygen and to water in liquid and vapour form.

Document US 2002/0068191 proposes an encapsulated light-emitting device with a light-emitting system comprising an organic electroluminescent layer between two electrodes. The organic electroluminescent layer being on a carrier substrate of the OLED and a protective cover such as a glass, which is sealed to the substrate by a covering adhesive film made of a thermosetting epoxy adhesive below the layer. The device is additionally provided at the periphery with an epoxy adhesive containing an oxygen-absorbing element (deoxidizer) and a surround made of aluminium over the circumference and over the outer edges of the cover and of the substrate. Arranged between this surround and the edges of the substrate are two bent conductive strips that are used for the electrical connections. For each strip, a first end is inserted into a groove made in the adhesive film (via a removable spacer) and this first end is on the associated electrode. The second end itself extends outside of the device.

The object of the invention is to provide an encapsulated light-emitting device with a simpler electrical connection system without sacrificing the durability, or even improving it, and in particular a device that is more compatible with industrial requirements (ease of obtaining on the production scale, reliability) even for large areas.

For this purpose, the invention provides an encapsulated light-emitting device comprising:
- a light-emitting system comprising an electroluminescent active layer positioned on a protective substrate and between two electrodes;
- a protective cover for said active layer, attached to the substrate;
- means for sealing against liquid water and/or water vapour;
- a surround, over the circumference of the device, made of at least one metal part or made of at least one plastic or glass part having a metal portion, the metal part or metal portion being used at least for a first electrical connection to one of the electrodes or a surround, over the circumference of the device, made of at least one part and at least one electroconductive layer deposited over one of the edges of the side of the substrate or of the cover and jutting out between the surround and the substrate or the cover for a first electrical connection to one of the electrodes.

By being used for at least one electrical connection, the surround, made of metal or with a metal portion, facilitates the connection points by limiting or even avoiding the use of the overhanging conductive strips from the prior art, the surround also protects from possible internal electrical connections and makes it possible to limit or even eliminate the paths for conduction of water generated by these overhanging strips.

By substitution of at least one bonded added-on overhanging conductive strip from the prior art, the invention also proposes to coat the substrate or the cover associated with one of the electrodes (at least one side edge and an outer edge) with an overhanging electroconductive layer (single layer or multilayer), preferably thin, deposited by any known means. This layer may be part of or be one of the electrodes, may be for example, a conductive enamel. In this configuration, the surround may be made of one or two parts, be entirely made of metal or be (mainly) dielectric, in particular made of glass or made of plastic, preferably with however an at least outer metallic liner.

These types of encapsulation are capable of withstanding extreme climatic conditions, in particular a high degree of humidity and/or a high temperature, and of guaranteeing a sufficient long-term protection.

Thus, the encapsulated light-emitting device according to the invention is simple, compact and reliable, durable, can be handled easily without risk of breaking the substrate or the cover, or of damaging the connections.

The surround may form, for example, a mounting frame (the body in the case of motor vehicle glazing units) or be mounted as double glazing for buildings.

The surround extends (at the very least mainly) over the circumference of the substrate and of the cover. The surround is neither arranged between the substrate and the cover nor held by the inner face of the substrate. Its assembly is simple.

This surround may be opaque since it is not capable of interfering with the properties of the light-emitting system, for example illumination via the faces of the substrate and/or of the cover.

The surround is suitable for any type of assembly of the substrate with the cover, in particular by lamination, by covering cast resin, or any other means at the periphery between the substrate and the cover, in particular a strut topped with adhesive, epoxy adhesive, polymeric seal.

The surround according to the invention is suitable for any type or any geometry of device. The substrate may be of any shape (rectangular, round, etc.). The device may be of any size, in particular with a surface area exceeding 1 m$^2$.

The surround according to the invention provides a sole or supplementary isolation (reinforcing optional means for sealing against liquid water and/or water vapour between the cover and the substrate) from various gas-type attacks, from liquids, from dust and/or to ensure mechanical reinforcement.

The surround may be hollow or solid, curved, flat, may or may not follow the contours of the device, in particular the side edge of the substrate. The surround may preferably have a portion, known as the side portion, encircling the circumference by being pressed via its inner face against the side edge of the substrate and held fast by the assembly means.

In order to encircle the whole of the circumference, the free ends of the surround may overlap in pairs or have complementary shapes suitable for mutually cooperating in order to assemble them as a butt joint. The ends may also be separated by glass spacers.

The surround may be thin. The surround may be made of at least one metal sheet made of aluminium, preferably having a minimum thickness of around 200 μm or made of stainless steel, preferably having a minimum thickness of around 500 μm.

The surround may be thicker, in particular in view of its attachment, for example to rails, in particular wall rails.

The surround may be in the form of a substantially flat section of around 1 mm in thickness and of substantially parallelepipedal cross-section. This section advantageously has a low mechanical inertia, that is to say that it may be easily wound up with a small winding radius of 10 cm for example.

The surround may be preformed (cast, moulded, extruded, etc.), folded over the cover and the substrate by a folding system. Thus, in the course of the process, the corners are bordered for example by bending using machines well known to those skilled in the art of converting materials, for example metallic materials.

The surround may be rigid enough to achieve the function of mechanically supporting the substrate and the cover. In this configuration, its rigidity is defined by the very nature of its constituent material, the linear buckling strength of which must be at least 400 N/m.

The surround may be arranged as a tape over the side edges and guarantee the mechanical assembly of the device by virtue of the assembly means which ensure its complete adhesion to the cover and to the substrate.

The surround may be composite, that is to say with at least one portion made of plastic that is optionally reinforced, in particular by fibres or made of glass, and a metal portion or else a metallized glass. For example, the plastic, for example butyl, may serve as reinforcement and/or as support for a metallic or metal-based film optionally mixed with synthetic material on the inner and/or outer walls.

This protective film, which is metal-based or entirely metallic, in particular of the aluminium or stainless steel strip type is used for better impermeability, in particular to water vapour, and/or for one of or the electrical connections. This film may be, for example, from 2 to 50 μm in thickness or more. This strip may additionally protect a plastic surround against abrasion, for example when it is handled or transported and favours heat exchange with a thermoplastic when it must be softened during the manufacture.

An outer metallic film may also be wide enough to be folded over the main outer edges of the substrate and/or of the cover or to be folded back against the inner face.

A metallic film on the inner face of the plastic with one of or the ends overhanging the edges of the plastic, may be used for the electrical connection.

A metallic film on the inner face that overhangs may be associated with conductive assembly means in order to be used for the electrical connection.

The plastic surround may very advantageously intrinsically incorporate, partly or completely, a desiccant in powder or granule form. The desiccant may be a molecular sieve such as powdered zeolite, the proportion of which may reach up to 20% by weight or around 10% by volume. The amount of the desiccant may be a function of the service life that it is desired to attribute to the device.

The surround and the means for assembling the surround with the cover and the substrate may form a single element comprising a(n) (adhesive) membrane composed in bulk of a polyisobutylene-based material, a membrane covered over the outer surface by a film composed of metal and of synthetic material(s). In this configuration, overhanging layers are preferably chosen for the electrical connections.

The surround may be mainly, or even completely, metallic, in particular made of aluminium, preferably having a minimum thickness of around 0.2 mm or made of stainless steel, preferably having a minimum thickness of around 0.5 mm.

The metallic surround or the metallic strip of a composite surround may itself be covered by corrosion protection means, preferably by a polysulphide or a polyimide, in particular for outdoor use.

The surround may be assembled via the side edge of the flat substrate and/or the sides of the cover (its side edge if the cover is flat) and/or via the edges of the main outer faces of the (flat or curved) cover and/or of the substrate.

For example, in one form that is simple to achieve, the surround may have a U-shaped cross section.

In one advantageous mode, the surround is at least partly assembled via the side edge of the substrate and/or via the side edge of the chosen flat cover.

Naturally, in this mode, the substrate and/or the chosen flat cover is thick enough to support the surround. For example, the substrate and/or the cover may have a thickness between 1 mm and 10 mm, preferably of at least 2 mm, more preferably still between 4 and 6 mm.

In forms that are simple to achieve, the surround may have a rectangular cross section (support of the surround by the side edge of the substrate and the edges of the cover) or an L-shaped cross section (support of the surround by the side edge of the substrate and the edges of the cover).

The assembly means may be chosen, at least partly, from one of or the following means:
  an adhesive, in particular a double-sided adhesive, an adhesive which sets via a chemical reaction that may or may not be activated by heat or by pressure or else by cooling, in particular a UV crosslinkable, or preferably infrared (IR) crosslinkable, adhesive, a single-component or two-component adhesive, with or without solvent (without degassing), for example an epoxy adhesive;
  a material that is impermeable to water vapour and is based on hot-melt polymer(s) chosen from at least one of the following polymer families: ethylene/vinyl acetate, polyisobutylene, polyamide, optionally covered by a material that is impermeable to liquid water such as a polysulphide or polyurethane or a silicone;
  an adhesive that is impermeable to water vapour and liquid water of the glue type such as a hot-melt polyurethane;
  at least one solder, if necessary applied with ultrasounds or a weld.

The aforementioned hot-melt polymer may also be in the form of copolymers, or of branched polymers. These three hot-melt polymer families are particularly advantageous in at least two ways: they offer intrinsically high sealing, and they are, in particular, very impermeable to water in vapour form. Being hot-melt polymers, they are also particularly easy to process, at a lower cost: they can be easily injected in liquid or semi-liquid form into the desired locations, via known industrial means. These polymers preferably constitute between 40 and 980% by weight of the constituent material of the seal. Specifically, it is possible to add thereto additives that have, in particular, three different functions.

On the one hand, it is possible to add at least one crosslinking agent, for example of the isocyanate and/or epoxide type. On the other hand, it is possible to add a certain number of mineral fillers, preferably in powder form, and, for example, made of aluminium or magnesium oxide, silica sand, quartz, diatomaceous earths, thermal silica, also called pyrogenic silica, or else non-pyrogenic silica. They may also be silicates, such as talc, mica or kaolin, glass microspheres, or else other mineral powders such as calcium carbonate, or mineral fibres.

Finally, it is possible to add one or more resins known as "tackifying" or "bonding" resins, the function of which is to improve the adhesion of the seal with the material with which it will be in contact. In particular, they may be compounds with a very low molar mass, of at most 10 000, in particular less than 5000 or between 500 and 2000, and a softening point preferably between 50 and 130° C., in particular between 90 and 100° C. One example is a saturated hydrocarbon-based aliphatic resin.

Specifically, it is important not only to choose an intrinsically impermeable polymer but one that also adheres very well to the materials with which it is in contact, so as to avoid creating diffusion paths at the interface between the seal and the material to be sealed, and to avoid any delamination of the seal.

Instead of or in addition to the use of such a bonding agent, the distribution of the molar masses present in the hot-melt polymer may also be varied, most particularly in the case of polyisobutylenes. By mixing several molar masses it is possible to achieve good creep resistance at temperature (in respect of the high molar masses) and also to achieve good adhesion to the materials to be sealed and good "tack" (in the case of low molar masses).

Overall, these hot-melt polymer seals advantageously have:
- a permeability to water in vapour form that is less than or equal to 3 g/m²/24 h, in particular less than or equal to 1 g/m²/24 h, according to the ASTM E 9663 T standard: this means that they are particularly impermeable to water;
- a softening point between 70 and 180° C., in particular between 90 and 100° C. or between 145 and 170° C.: it is therefore possible to liquefy them in order to lay/form them at industrially acceptable temperatures;
- a viscosity between 0.8 and 8 Pa·s, measured at 190° C.

Advantageously, if this proves necessary, the seal described previously may be combined with at least one other seal which is "complementary" in the sense that it complements its sealing function, in particular with regard to liquid water. Thus, this may be a second seal of the polysulphide, polyurethane or silicone type which may be placed against the first seal by coating the latter, in a known manner, or by coextrusion and/or simultaneous extrusions of the two seals.

To achieve the sealing, in particular with respect to liquid water, it is possible to form a seal that covers assembly means that are impermeable to water vapour:
- by extrusion of polyurethane (PU) or of any thermoplastic elastomer (TPE) polymer;
- by reactive injection moulding (RIM) of PU;
- by thermoplastic injection moulding of a PVC (polyvinyl chloride)/TPE blend;
- by injection moulding and vulcanisation of an ethylene-propylene-diene monomer (EPDM) terpolymer.

Most particularly preferred are adhesives of the polyurethane-based hot-melt adhesive type, in particular that can be crosslinked with the moisture in the air and that ensure both a good impermeability to water vapour and to liquid water. Their permeability to water in vapour form is typically less than or equal to 3 g/m²/24 h, or even close to 2 g/m²/24 h.

Naturally, the adhesive must preferably also withstand debonding by liquid water, by ultraviolet radiation and also by the pulling forces that may be exerted perpendicularly to the faces of the glazing unit that are commonly referred to as shear stresses, and by the pulling forces exerted parallel to the force of the weight of the glazing unit. A satisfactory adhesive must preferably have a tear strength of at least 0.45 MPa.

Preferably, the adhesive may have rapid bonding properties, bonding in the order of a few seconds. The setting of an adhesive may also be slow in order to verify the electrical connections or even to redo them.

The water vapour permeability coefficient of the assembly means may preferably be less than 5 g/24 h·m², more preferably still less than 1 g/24 h·m².

The choice of assembly means may depend on:
- sealing performances of the covering or peripheral means for assembling the cover to the substrate;
- and/or on the optional presence of an additional material for the sealing between the surround and the covering or peripheral means and/or a desiccant.

The assembly means may be chosen to be electrical insulators, then preferably having an electrical conductivity of less than $10^{-4}$ ohm$^{-1}$·cm$^{-1}$.

Alternatively, in order, in particular, to facilitate the electrical connection(s) through the surround, the metal part or the metal portion may be assembled, at least partly, by conductive assembly means over the majority or over the whole of the circumference or over the main outer edges of the cover or of the substrate, chosen from at least one of the following assembly means: a solder, a weld, a conductive adhesive, in particular an epoxy-type adhesive filled with silver.

In order to do this, the device may comprise at least one of the (combined or alternative) features described below for the connection(s).

For at least the first electrical connection, and preferably for each of the electrical connections, it comprises at least one of the following means:
a, preferably thin, internal electrical connection means, in particular chosen from at least one of the following electrical connection means joined to the surround:
- at least one electroconductive wire, for example a metal wire, for example made of copper, gold, silver, aluminium or tungsten;
- at least one optionally (self)adhesive electroconductive strip, in particular metal strip, of the foil type, for example between around 50 µm and 100 µm thick, optionally that extends preferably along a main inner edge of the substrate or of the cover for a better current distribution;
- an electroconductive fill material, in particular a foam, an optional bonding material deposited by ink jet filled with silver or copper type metal (nano)particles;
- an electroconductive enamel, around 10 µm to 100 µm thick, optionally that extends preferably along a main inner edge of the substrate or of the cover for a better current distribution;
- an electroconductive adhesive, for example an epoxy adhesive filled with silver;
- at least one solder optionally extending one or more assembly solders.

One known foil is a thin strip of copper having a thickness of 50 to 100 µm and a width between 1 and 100 mm, preferably between 3 and 5 mm. The copper strips are covered by a tinning, for example based on tin or on a tin/lead alloy in order to limit corrosion and facilitate the electrical contacts, for example by solders.

To simplify the electrical connection through the surround, the device may comprise, for at least the first electrical connection, an internal connection means that juts out over at least one edge of the side of said substrate or of said cover, and is chosen from one of or the following means:
- a foil-type electroconductive strip;
- an electroconductive enamel;
- an electroconductive adhesive;
- a thin electroconductive layer (single layer or multilayer) that is optionally transparent;
- these means preferably being combined with solders for assembling via the side edge of the cover or of the substrate,
- and/or a portion that juts out from one of the electrodes, in particular under a solder for assembling the side edge of the cover or of the substrate.

The other electrode added to the substrate may conversely not be jutting out, confined to the main inner face of the substrate.

According to one feature, one of the electrodes may comprise two portions that jut out over two, possibly opposite, edges, of the side of the substrate or of the cover, one of the portions that juts out being electrically insulated from the other portion that juts out (by any mechanical, chemical or laser treatment means) and being used for an electrical connection of the other electrode.

The surround may at least be made of two metal-based parts that are used for a separate electrical connection, the parts being attached and electrically insulated by at least one of the following means:
- a material based on hot-melt polymer(s) chosen from at least one of the following polymer families: ethylene/vinyl acetate, polyisobutylene, polyamide, optionally covered by a material that is impermeable to liquid water such as a polysulphide or polyurethane or silicone;
- an adhesive that is impermeable to water vapour and liquid water of the hot-melt glue type such as a polyurethane.

Preferably, means identical to the non-conductive assembly means are chosen.

The surround may also be a single metal-based part that is used for the first connection and preferably the second electrical connection is produced by a through-hole preferably made in the chosen dielectric cover, the hole being filled by a solder and/or by another electroconductive material (foam, etc.). The hole may have a dimension of the order of 5 mm.

Furthermore, a covering metal pellet may be welded around the hole.

The electrode known as the lower electrode is the closest to the substrate (or even is an actual part of a conductive substrate), the electrode known as the upper electrode is the furthest from the substrate.

The cover may be attached to the substrate by what is known as a peripheral means surrounding the layer or by what is known as a covering means, over the active system (by thermoplastic sheet-type lamination interlayer, by epoxy-type cast resin, etc.).

A spacing or peripheral linking means may avoid damaging the light-emitting system (pollution, risk of short-circuit, etc.) and may be easy to position and/or economical. The peripheral means may also make it possible to prevent the cover from touching the system, even if the cover is flat.

This peripheral means may be:
- an adhesive, in particular a UV-curable adhesive such as, for example, the commercial adhesive AC-A1438 from Addision Clear Wave, or else the adhesive XNR4416L from Nagase, or else an infrared (IR)-curable adhesive, a single-component or two-component solvent-free adhesive, for example an epoxy adhesive, or even an acrylic adhesive;
- a glass spacer with adhesive on its bearing faces;
- or else a molten glass frit.

Preferably, this peripheral means may be impermeable to liquid water, more preferably still to water vapour such as, most particularly, the glass frit.

The choice of the peripheral means may depend on:
- sealing performances of the surround and of the assembly means;
- the optional presence of a desiccant or of another impermeable material between the surround and the peripheral means;
- the method of manufacturing the device (carried out continuously or in several steps).

The position of the peripheral means naturally depends on the area and on the arrangement of the active layer on the substrate and of the size of the cover. The peripheral means may be over the main edges or edges closest to the centre of the cover.

The device may also form a laminated glazing unit. Laminated glazing units are usually composed of two rigid substrates, positioned between which is a thermoplastic polymer sheet or a superposition of such sheets. The invention also includes what are known as "asymmetric" laminated glazing units that use a single rigid protective substrate of the glass type combined with several protective polymer sheets.

The invention also includes laminated glazing units that have at least one interlayer sheet based on a single-sided or double-sided adhesive polymer of the elastomer type (i.e. one that does not require a lamination operation in the conventional meaning of the term, i.e. lamination requiring heating generally under pressure in order to soften the thermoplastic interlayer sheet and make it adhere).

In this configuration, the means for attaching cover and substrate may then be a lamination interlayer, in particular a sheet of thermoplastic, for example polyurethane (PU), polyvinyl butyral (PVB), ethylene/vinyl acetate (EVA), or a multi-component or single-component resin that is heat-curable (epoxy, PU) or ultraviolet-curable (epoxy, acrylic resin). It preferably has (substantially) the same dimensions as the cover and the substrate.

The lamination interlayer may make it possible to prevent the cover from flexing, especially for large devices, for example with an area greater than $0.5 \text{ m}^2$.

In particular, EVA offers many advantages:
- it contains little or no water by volume;
- it does not necessarily require high pressure for processing it.

A thermoplastic lamination interlayer may be preferred to a covering made of cast resin as it is both easier to implement and more economical and is possibly more impermeable.

The interlayer optionally includes a network of electroconductive wires set into its inner surface, facing one electrode, and/or an electroconductive layer or electroconductive strips on said inner surface.

And in the latter design, it may preferably comprise one of the following electrical connection means associated with one or the other of the electrodes:
- an electroconductive strip, in particular U-shaped, of foil type, fastened to at least one edge of the lamination interlayer (by softening of the thermoplastic material preferably) and in contact with an inner wall of the metallic surround (by soldering preferably);
- an electroconductive strip, in particular U-shaped, of foil type, with a first end joined to said electrode (by soldering preferably) and with a second end in contact with a through-hole filled with metallic material of a dielectric cover and between these ends a portion that passes through said interlayer, which is cut.

When the peripheral or covering connecting means is sufficiently impermeable in the short term, this makes it possible to store and/or transport the sealed device. Specifically, the assembling of the surround is not necessarily carried out in the place where the system is produced or else this assembling may be postponed, for manufacturing flexibility.

When the complete device is produced continuously, it is not necessary to provide a connecting means that is (particularly) impermeable, especially to water vapour, and/or a desiccant if the surround, once assembled, obtains a sufficient protection threshold. In this case, the peripheral-type connecting means has the role of a spacer between the substrate and the cover.

The device according to the invention may comprise a desiccant positioned preferably on the substrate, on the outer edge of the peripheral or even covering means and/or mixed with this means.

Thus positioned, the desiccant surrounding the seal is in a small quantity. It is on the water conduction path and the closest possible to the set back peripheral or covering connecting means. This desiccant may be opaque, which is less expensive than a transparent desiccant, even in a configuration where the emitting system emits from two sides.

The desiccant may be a tape, in particular an adhesive tape or else a powder, such as calcium oxide or other alkali or alkaline-earth metal oxides. This powder is preferably compacted by pressure of the surround and optionally of an edging fill material. This compacting makes it possible to further improve its drying properties.

When the cover is flat and has a size smaller than that of the substrate, it is possible to choose a thick cover, for example a 3 mm cover, in order to position the desiccant.

When the cover is flat and has a size substantially equal to that of the substrate, it is possible to choose a thick cover with a thinned down peripheral zone, for example a bevelled edging, in order to position the desiccant.

Moreover, the device may comprise a fill material that forms a bead or a seal between the surround and the covering or peripheral means.

The fill material seal may have one of the following features:
be adhesive (in particular a solvent-free adhesive);
be impermeable with respect to water in vapour form;
be non-conductive.

The seal that is impermeable with respect to water in vapour form may especially be based on hot-melt polymer(s) chosen from at least one of the three polymer families mentioned above, most particularly for the attachment means.

Preferably this fill material may have an electrical conductivity less than at least $10^{-4}$ ohm$^{-1}$·cm$^{-1}$, in particular less than $10^{-5}$ ohm$^{-1}$·cm$^{-1}$, and even less than $10^{-7}$ ohm$^{-1}$·cm$^{-1}$ or $10^{-9}$ ohm$^{-1}$ cm$^{-1}$ (like, optionally, the assembly means if necessary). By choosing a seal that is mainly insulating in electrical terms, the absence of a risk of short-circuit from one electroconductive layer to another via the seal is ensured. It is possible to choose, for example, the seals described in Patent EP 0 836 932. These are seals made of a polymer matrix based on thermoplastic or thermosetting polymer(s), preferably based on elastomer(s) (A), in particular of the mainly saturated hydrocarbon-based elastomer type, preferably chosen from rubbers based on mono-olefins such as isobutylene or ethylene-propylene, or polyolefins catalysed by metallocene catalysts, or based on ethylene/vinyl acetate (EVA), or based on ethylene/vinyl butyrate (EVB), or based on silicone(s) or on polyurethane(s).

This type of seal may be partially or completely crosslinked, in particular using crosslinking agents of the isocyanate or epoxide type. It is preferably a polymer based on elastomer(s). Specifically, the latter type of polymer is advantageous in the sense that it has glass transition (transmission vitreuse) temperatures which are markedly below the ordinary temperature of use, that its features allow it to be incorporated into the active glazing unit using well-controlled automated techniques, such as the technique of extrusion, and that it exhibits good adhesion to substrates, in particular glass substrates.

The preferred elastomers are, for example, chosen from mainly saturated hydrocarbon-based polymers (hydrocarbon-based polymers, silicones), preferably chosen from the monoolefin-based polymers such as isobutylene or ethylene-propylene, or polyolefins catalysed by metallocene catalysts, in particular of the polyethylene type.

Polyolefins, of the polyethylene, ethylene/propylene copolymer, ethylene/propylene/butene copolymer, polymethylpentene, propylene, isobutylene/isoprene, ethylene/vinyl acetate (EVA) or ethylene/vinyl butyrate (EVB) type, may also be used. It is also possible to use polymers of the polyurethane family or, as mentioned above, of the silicone family, more particularly those having the unit (présentant le motif): where $R_1$ and $R_2$ may be, in particular, halogens of the chlorine type, hydrocarbon radicals of the saturated type, such as a methyl or ethyl group, or of the aromatic type, such as a phenol, or finally a hydrogen.

It is advantageous for the polymer matrix to consist not of a single polymer of the elastomer type, but of a number of them, in particular at least three, having different molar masses. Preferably, these are chosen from a range of molar masses of at least $2\times10^4$, for example between $3\times10^4$ and $2\times10^6$.

The polymer matrix of the seal may also contain a bonding agent, a filler, in particular one chosen to be barely or not at all electrically conductive, preferably that is inorganic and in powder form. The presence of filler in the matrix may help to give it the desired mechanical strength. These fillers may be of the metal oxide type such as aluminium oxide or magnesium oxide, of the sand type, such as silica sand, quartz, diatomaceous earths, thermal silica, also called pyrogenic silica, or else non-pyrogenic silica. They may also be silicates, such as talc, mica or kaolin, glass microspheres or balls, or else other inorganic powders, such as calcium carbonate.

It is furthermore possible to anticipate crosslinking the polymer matrix of the seal, for example with a crosslinking agent of the isocyanate and/or epoxide type.

These aforementioned seals may also act as electrically insulating assembly means preferably in combination with the overhanging layers and/or as means for attaching two metal parts to be electrically insulated.

The substrate and the protective cover may be of any nature (mineral, in particular glass, or organic, in particular plastic) as long as they are sufficiently impermeable to dust, liquids and gases.

Preferably, the protective cover may be flat, of constant thickness, optionally with a bevelled side edge or main edges opposite the substrate that are grooved and/or pierced, in particular to create a space for the connection system, or to add a seal and/or a desiccant.

The substrate and the protective cover may preferably be rigid or semi-rigid. The expression "rigid or semi-rigid" is understood to mean an element that may especially be based on glass or on polymer(s) of the polyethylene terephthalate (PET), polymethyl methacrylate (PMMA) or polycarbonate (PC) type.

The substrate and the protective cover may in particular be flat, bent or toughened glass sheets, for example soda-lime-silicate glass sheets, optionally associated with polymer (PET, etc.) sheets. The protective cover may have a size that is smaller, larger or equal to the substrate.

The cover and the substrate may be transparent, semi-opaque or opaque depending on the emission configurations. The substrate may also preferably be a glass sheet.

The distance between the substrate and the cover may preferably be as small as possible. It generally corresponds grosso modo to the height of the connecting means, i.e. typically a few microns for a glue-type adhesive, a few hundreds of microns for a glass frit, a few tenths of mm for a thermoplastic lamination.

The light-emitting system may itself be ultrathin, for example not exceeding a few microns, or even around 500 nm.

Furthermore, the distance between the peripheral or covering means and the side edge of the cover and/or the distance between the side edge of the cover and the side edge of a chosen substrate of smaller size may be at least 1 mm to facilitate the electrical connections and/or to position a desiccant and/or an additional sealing bead.

The cover and the surround may have, in an assembly zone, complementary texturings or roughnesses in order to slow down water penetration. This is preferably a question of the main edges of the cover or of the substrate.

Most particularly in the case of an assembly via the side edge, the substrate may have a smooth side edge for a better assembly.

The system electroluminescent may be of various designs:
either the system borne by the substrate and preferably the electroluminescent layer is thin and organic or inorganic;
or one of the electrodes, known as the lower electrode, is associated with the substrate, in particular deposited on the substrate, the other of the electrodes, known as the upper electrode, is at least partly associated with the cover, in particular deposited on the cover and preferably the electroluminescent layer is inorganic and thick.

The aforementioned connection methods are suitable regardless of the electrode configurations.

In a first configuration, the lower electrode is an electroconductive layer, wider than the active layer and that extends, for example, over one edge of the substrate. The upper electrode is an electroconductive layer that extends over the substrate, and that extends, for example, over the opposite edge. The connections take place on the inner face of the substrate and/or over its side edge (overhanging electrode, etc.).

In a second configuration, the upper electrode is not added to the substrate, it is electrically connected:
via the side, on top of the substrate (for example via an internal wire and/or via an adhesive, a foil, etc.);
and/or via the top, for example via the pierced cover or via an electroconductive assembly means and/or via a network of electroconductive wires set into the surface of a lamination interlayer forming said covering means.

The device is not necessarily symmetrical. It is thus possible to provide different electrical connection methods for the two electrodes or else dissymmetrical assembly methods.

The electrodes may be electroconductive layers advantageously chosen from metal oxides, especially the following materials:
doped tin oxide, in particular doped with fluorine, $SnO_2$:F or with antimony, $SnO_2$:Sb (the precursors that can be used in the case of CVD deposition may be tin organometallics or halides combined with a fluorine precursor of the hydrofluoric acid or trifluoroacetic acid type);
doped zinc oxide, in particular doped with aluminium, ZnO:Al (the precursors that can be used in the case of CVD deposition may be zinc and aluminium organometallics or halides) or with gallium, ZnO:Ga,
or else doped indium oxide, in particular doped with tin, ITO (the precursors that can be used in the case of CVD deposition may be tin and indium organometallics or halides), or zinc-doped indium oxide (IZO).

More generally, it is possible to use any type of transparent electroconductive layers, for example layers known as 'TCOs' (transparent conductive oxides), for example having a thickness between 20 and 1000 nm.

It is also possible to use thin metal layers known as 'TCCs' (transparent conductive coatings), for example made of Ag, Al, Pd, Cu, Pd, Pt In, Mo, Au and typically having a thickness between 2 and 50 nm. The electrodes are not necessarily continuous.

All the aforementioned electrode materials may be used for the overhanging electroconductive layers.

The electrodes may be deposited on a flexible substrate of the PET (polyethylene terephthalate) type that is positioned, for example, between two sheets made of a thermoplastic polymer of the PVB (polyvinyl butyral) type assembling the two rigid protective elements of the glass type.

The electroluminescent layer may be inorganic or organic or hybrid organic/mineral, and in particular thin.

A thin inorganic electroluminescent layer is referred to as a TFEL (thin film electroluminescent). This system generally comprises a layer known as a phosphor layer between two dielectric layers.

The dielectric layers comprise, non-exhaustively, the following materials: $Si_3N_4$, $SiO_2$, $Al_2O_3$, AlN, $BaTiO_3$, $SrTiO_3$, HfO, $TiO_2$.

The phosphor (thin or thick, inorganic electroluminescent) layer may be composed, for example, of the following materials: ZnS:Mn, ZnS:TbOF, ZnS:Tb, SrS:Cu,Ag, SrS:Ce.

Examples of stacks of inorganic electroluminescent layers are described, for example, in document U.S. Pat. No. 6,358,632.

An organic electroluminescent layer is generally referred to as an OLED. More precisely, OLEDs are generally divided into two broad families depending on the organic material used.

When the organic electroluminescent layers are polymers they are referred to as PLEDs (polymer light-emitting diodes). When the electro-luminescent layers are small molecules they are referred to as SM-OLEDs (small molecule organic light-emitting diodes).

One example of a PLED consists of the following stack:
a 50 nm layer of poly(2,4-ethylene dioxythiophene) doped with poly(styrene sulphonate) (PEDOT:PSS); and
a 50 nm layer of phenyl poly(p-phenylenevinylene) Ph-PPV.

The upper electrode may be a layer of Ca.

In general, the structure of an SM-OLED consists of a stack of a hole-injection layer, a hole-transporting layer, an emissive layer and an electron-transporting layer.

An example of a hole-injection layer is copper phthalocyanine (CuPC) and the hole-transporting layer may for example be N,N'-bis(naphthalen-1-yl)-N,N'-bis(phenyl)benzidine (alpha-NPB).

The emissive layer may for example be a layer of 4,4',4"-tri(N-carbazolyl)triphenylamine (TCTA) doped with fac-tris (2-phenylpyridine)-iridium) [Ir(ppy)$_3$].

The electron-transporting layer may be composed of tris (8-hydroxyquinoline)aluminium (Alq$_3$) or bathophenanthroline (BPhen).

The upper electrode may be an Mg/Al or LiF/Al layer.

Examples of organic light-emitting stacks are for example described in document U.S. Pat. No. 6,645,645.

In one particular embodiment, the electroluminescent layer is inorganic and the first electrode is based on a doped and/or undoped mineral oxide deposited at high temperature, preferably by pyrolysis in particular in the gas phase, on the electroluminescent layer and the second electrode is metallic, for example based on silver or on aluminium.

The device may furthermore integrate any functionality or functionalities known in the glazing field. Among the functionalities, mention may be made of the following: hydrophobic/oleophobic layer, hydrophilic/oleophilic layer, photocatalytic anti-soiling layer, stack reflecting thermal radiation (solar protection) or infrared radiation (low-emissivity), anti-reflection layer and reflecting layer for mirror effect.

Without being essential, it is however possible to envisage, between the electroluminescent layer and the cover, a protective layer such as a thin organic layer for example especially described in document US 2005/248270, for example thin layers of glass, of $Si_3N_4$, of $Al_2O_3$ or else of $SiO_2$.

The device may form (alternative or combined choice) a decorative or architectural lighting system, a signalling or display system—for example of the alphanumeric indicia, logo or drawing type placed both on the outside and on the inside.

The device may be intended for buildings, optionally mounted as double glazing, forming a façade in particular an illuminating façade, a (French) window, in particular an illuminating (French) window.

The device may be intended for a transport vehicle, such as a motor vehicle rear window, side window or illuminating sunroof, a rearview mirror, a windscreen section or a windscreen or for any other terrestrial, aquatic or airborne vehicle, in particular a porthole or a cockpit.

The device may be intended for urban furniture, such as a bus shelter, be a display cabinet, a jewelry display, a shop window, or a greenhouse.

The device may be intended for interior furnishings, especially being a shelf element, a mirror, an illuminating façade of a cabinet, an aquarium wall, being a paving stone, in particular an illuminating paving stone, for wall or floor or ceiling coverings.

The present invention will be better understood on reading the following detailed description of non-limiting exemplary embodiments and the following FIGS. 1 to 12 that schematically represent partial views of encapsulated light-emitting devices in various embodiments of the invention.

For the sake of clarity, the elements in the figures are not shown to scale.

FIGS. 1a to 1d represent partial schematic cross-sectional and bottom views of an encapsulated light-emitting device 100 in a first embodiment of the invention.

This encapsulated light-emitting device 100 is firstly composed of a light-emitting system 1 (i.e. one that emits UV and/or visible radiation), comprising:

a lower electrode 11 in the form of a transparent or reflective electroconductive layer, which is deposited on a first region (on the left in FIG. 1) of a flat, protective substrate 2 that is preferably dielectric, rigid and transparent (when the system emits via the substrate), such as a glass sheet 2;

an electroluminescent layer 12, which may be continuous or discontinuous, for example in the form of squares or other evenly distributed geometric patterns, or else that form signage;

an upper electrode 13 in the form of a transparent or reflective electroconductive layer that juts out over a second region of the substrate 2 (on the right in FIG. 1);

optionally an inorganic layer (not shown) for example an $Si_3N_4$ or $SiO_2$ layer, that leaves the edge(s) of the upper electrode 13 exposed for the electrical connections.

The light-emitting device may be organic, for example of OLED type. The inner face 21 is coated, in this order:

with a first (single-layer or multilayer) transparent electrode 11 such as a TCO layer;

with the organic light-emitting system 12 (OLED) typically formed:

from a layer of alpha-NPB (NPD);
from a layer of TCTA+Ir(ppy)$_3$;
from a layer of BPhen; or
from a layer of LiF; and
with a second reflective, in particular metallic, electrode 13, preferably in the form of an electroconductive layer, in particular one based on silver or aluminium.

The light-emitting device (for all the embodiments) may be thin and inorganic. The inner face 21 is coated, in this order:

with an electrode having a (single-layer or multilayer) transparent electroconductive layer;

with an inorganic electroluminescent system (TFEL) typically formed:

from a layer of $Si_3N_4$;
from a layer of ZnS:Mn;
from a layer of $Si_3N_4$;
from a reflective electrode in the form of an electroconductive layer that is in particular metallic and preferably based on silver or aluminium.

The light-emitting device may be inorganic and thick and comprise:

an electroconductive TCC or TCO layer;
a thick layer of ZnS:Mn deposited by screen-printing;
a layer of $BaTiO_3$;
a reflective electroconductive layer optionally topped with a TCC or TCO layer.

The glass sheet 2 is around 3 to 10 mm thick, optionally extra-clear, having an area which may be of the order of m$^2$, and with main outer edges 22 and main inner edges 23. Its side edge 21 is preferably smooth. The sheet 2 is optionally thermally or chemically toughened and bent.

The device 100 also comprises a protective cover 3 for the electroluminescent layer 12, a cover that is impermeable to dust, air, liquid water and gases. This cover 3 is preferably a glass sheet that has an side edge 31 with a thickness between 0.5 mm and 10 mm, in particular of the order of mm and main outer edges 32 and main inner edges 33. The sheet 3 is optionally thermally or chemically toughened and bent.

In one application of an illuminating tile or of illuminating tiling, it is possible to adjust the thickness of the cover 2 to bring the device 100 to the same level as the surrounding (floor or wall) tiles or tiling.

The protective cover 3 is for example of the same shape as the substrate 2, for example rectangular. In this embodiment it has a smaller size than the substrate 2.

The protective cover 3 is sealed to the substrate by a peripheral connecting means, surrounding the active layer 12 as close as possible and that preferably guarantees an impermeability to air, to dust and to water.

For example, an epoxy adhesive 41 is chosen that is UV-curable or even IR-curable if the layer 12 withstands heat. This adhesive 41, having a thickness of around 10 μm, keeps the cover system at bay and is deposited over a width for example of 1 to 5 mm. This adhesive 41 is deposited for example directly on the electrodes 11, 13 or else on the optional protective inorganic layer.

As a variant of the connecting means, it is possible to choose a glass spacer may be chosen with adhesive on the bearing faces or a lamination interlayer in the form of a sheet of thermoplastic, in particular of PU, PVB or EVA type.

The device 100 is also provided with a surround 50 over the circumference of the device 100, which provides an improved impermeability to air, dust, liquid water and gases and also a better mechanical strength.

This surround 50 is preferably rigid, most particularly metallic, for example made of stainless steel or aluminium.

This surround 50 is for example thick, in particular having a thickness of around 1 mm to facilitate its attachment and reinforce the device.

This surround may also be thin, having a thickness of around 0.1 mm.

This surround 50 is for example made of a plurality of parts, for example two parts 5a, 5b that each form an L-shape in cross section. Each part 5a, 5b comprises:

- a side portion 51, 53 pressed against an edge or edges of the side 21 of the substrate 2;
- a flat covering portion 52, 54, at 90° to the side portion 51, 53 and joined to the substrate 3 via one or more main outer edges 32 of the cover 3.

For the sake of clarity, the two parts 5a and 5b are not represented in their entirety in FIG. 1a.

As shown in FIG. 1b, these side portions 51, 53 may form two "U" shapes or else in a variant that is not shown two "L" shapes.

The side portions 51, 53 may be pressed over the circumference by bending. The covering portions 52, 54, may be folded over the cover 3 by bending.

The respective assemblies of the side portions 51, 53 to the substrate 2, and of the covering portions 52, 54 to the cover 3 are achieved by an assembly means that is preferably impermeable to dust, air and water, for example an IR-curable epoxy adhesive 61, 62, a polymer material that is impermeable to liquid water and water vapour such as a polyurethane hot-melt polymer, or a hot-melt polymer chosen from at least one of the following polymer families: ethylene/vinyl acetate, polyisobutylene, polyamide, optionally combined with a watertight polymer such as a polysulphide, a polyurethane or a silicone.

To slow down water penetration, the inner surfaces of the covering portions 52, 54 and the main outer edges 32 of the cover 3 may have complementary texturings in the assembly zones.

The side portions 51, 53 (respectively the covering portions 52, 54) have their free ends that are butted together, for example at the middle of two opposite edges of the substrate (respectively of the cover).

In the variant shown in FIG. 1c, the side portions 51, 53 (and the covering portions) are sheets that overlap.

In the variant shown in FIG. 1d, these side portions 51, 53 (and the covering portions) fit together.

The attachment of the two parts 5a, 5b to one another is carried out via an attachment means 610 chosen to be electrically insulating that may be identical to the aforementioned assembly means 61, 62.

The surround may be protected from corrosion for example by a plastic 620 of polysulphide or polyimide type. The latter also protects the seal 610 from liquid water.

The distance between the inner edge 23 and inner wall of each covering portion 52,54 is at least a few mm and the distance 11 between the side edges 21 and 31 is at least a few mm in order to improve the sealing by positioning materials provided for this purpose and/or in order to facilitate the connections.

Thus, in the internal space defined by the substrate 2, the cover 3, the surround 50 and the peripheral seal 41, the following are preferably positioned:

- as close as possible to the connecting means 41, a desiccant in the form of a powder 71 surrounding this seal, or else in the form of an optionally self-adhesive pellet;
- and a seal 81 that is impermeable to water vapour surrounding the desiccant 71, and protected by the electrically insulating surround 5, for example a grey polyisobutylene sold by Teroson under the name Terostat-969G.

In the aforementioned example, the seal is a hot-melt. It is soft at ambient temperature or it is possible to melt it, then inject it under pressure. It may also be placed at the periphery of the glass. The operation of positioning the surround 50 calibrating it to the desired cross section under the effect of the pressure.

Alternatively, the seal 81 is replaced by a bead of adhesive without degassing.

For the power supply, first and second electric wires 91, 92—or foils—are connected to the outer walls of the surround 50 (passing through the optional anti-corrosion coating 620). Each of the parts 5a, 5b of the surround is connected respectively to the lower electrode 11 and upper electrode 13 by internal connections means. These are electric wires fastened by soldering or conductive bonding to the inner walls and fastened by soldering or conductive bonding directly to the electrodes or to conductive strips 110, 130 that are spread along the main inner edge(s) 23 of the substrate to ensure an optimum current distribution.

These conductive strips that form busbars 110, 130 may preferably be made of silver enamel, for example deposited by screen-printing, then around 10 μm to 100 μm thick, or else are made of material deposited by ink jet filled with silver or copper type metal (nano)particles.

The arrangement of the electrodes 11, 13 on the substrate 2 may be different. For example, the upper electrode 13 may be present in the four corners of the inner edges 23 and the lower electrode 11 runs along these inner edges 23 between these corners. Therefore the positions and system of internal connections are chosen accordingly.

The device 100 may have other modifications described below.

The positions of the desiccant 71 and of the seal 81 may be modified. For example, the cover 2 has a size substantially equal to that of the substrate, is thick, in particular between 4 and 6 mm and has a bevelled edge over all its edges. This bevel makes it possible to create enough space to position on the border the desiccant 71 and/or the fill material 81. Grooves with a width of a few mm may also be made in the main inner edges 32. The zones for assembling the covering portions with the main outer edges 33 may be enlarged, further improving the sealing and the solidity of the device 100.

The connecting seal may be a glass frit that is impermeable enough not to use a desiccant 71, or fill material 81 and to replace the epoxy adhesive 61, 62 with ordinary adhesive, for example an acrylic adhesive or a double-sided adhesive.

Figure 2B:
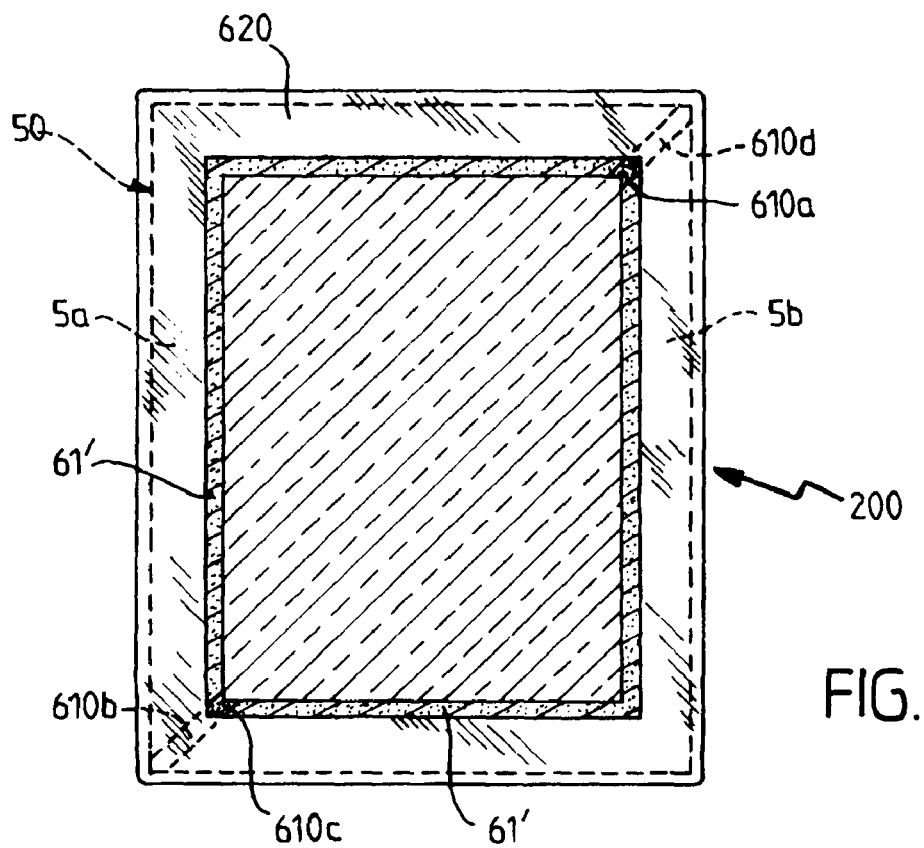

FIGS. 2a and 2b represent partial schematic cross-sectional and bottom views of an encapsulated light-emitting device 200 in a second embodiment of the invention.

This device 200 differs from the first device 100 by the features presented below relating to the electrical connection.

One portion of the adhesive for the assembly with the substrate 2 is chosen to be conductive 61', for example based on an IR-curable epoxy resin filled with silver. The device 200 then does not necessarily comprise internal electric wires or busbars.

To avoid short-circuits, use is made for the assembly, as for the attachments of the metal parts 5a, 5b to the surround 50, of electrically insulating means 610a to 610d, for example one of or the polymer materials that are impermeable to liquid water and water vapour mentioned previously. As shown in FIG. 2b, the attachment may be carried out at the corners.

The conductive adhesive 61' may also be provided solely in restricted zones. In this configuration, it is then preferred to add busbars to the electrodes for a better distribution of the current.

The conductive adhesive 61' may cover the inner walls (the adhesive 62 is then eliminated).

The conductive adhesive 61' (and the adhesive 62) may additionally be partially or completely replaced by solders or welds.

The second device 200 may naturally incorporate other features already described for the first embodiment, especially in the variants thereof (connecting by glass frit, lamination, absence of desiccant, bevelled cover, surround of straight section, etc.).

Figure 3:
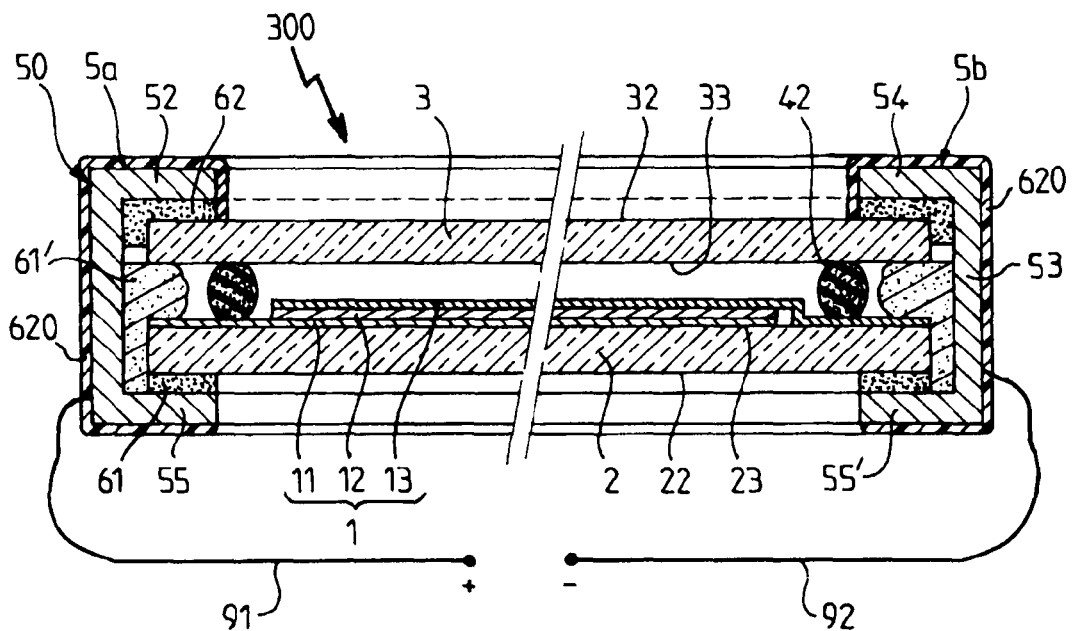

FIG. 3 represents a schematic cross-sectional view of an encapsulated light-emitting device 300 in a third embodiment of the invention.

This device 300 differs from the second device 200 by the features presented below.

The connecting seal is a molten glass frit 42 having a thickness of the order of 100 μm (de la centaine de 100μ). The frit 42 is impermeable enough not to use a desiccant or a seal on the border and to replace the assembly means and attachment means with ordinary adhesive, for example an acrylic adhesive or a double-sided adhesive.

The substrate 2 and the cover 3 have the same dimensions. The cover 3, like the substrate 2, may be thin, for example 0.3 mm in thickness.

The surround 50 comprises two supplementary covering portions 55, 55' associated with the main outer edges 22 of the substrate 2.

The surround 50 is assembled both via the main outer edges and the side edges 21, 31. The side portions 51, 53 are assembled via the dielectric adhesive 62 to the cover 3. The side portions 51, 53 are assembled to the substrate 2 both via the conductive adhesive 61' and via electrically insulating means 61 such as an adhesive epoxy or the aforementioned impermeable polymers or solely via the conductive adhesive. The assembly zones of the covering portions 52, 54, 55, 55' are broad.

The conductive adhesive 61' may cover the inner walls (the adhesive 62 is then eliminated).

The conductive adhesive 61' may additionally be partially or completely replaced by solders.

The third device 300 may naturally incorporate other features already described for the other embodiments (connecting by lamination, by glass frame, or by epoxy adhesive, bevelled cover, etc.).

To manufacture the device 300, it is possible to place a portion of the conductive adhesive 61' on the surface of the electrodes 11, 13 before sealing.

Figure 4:
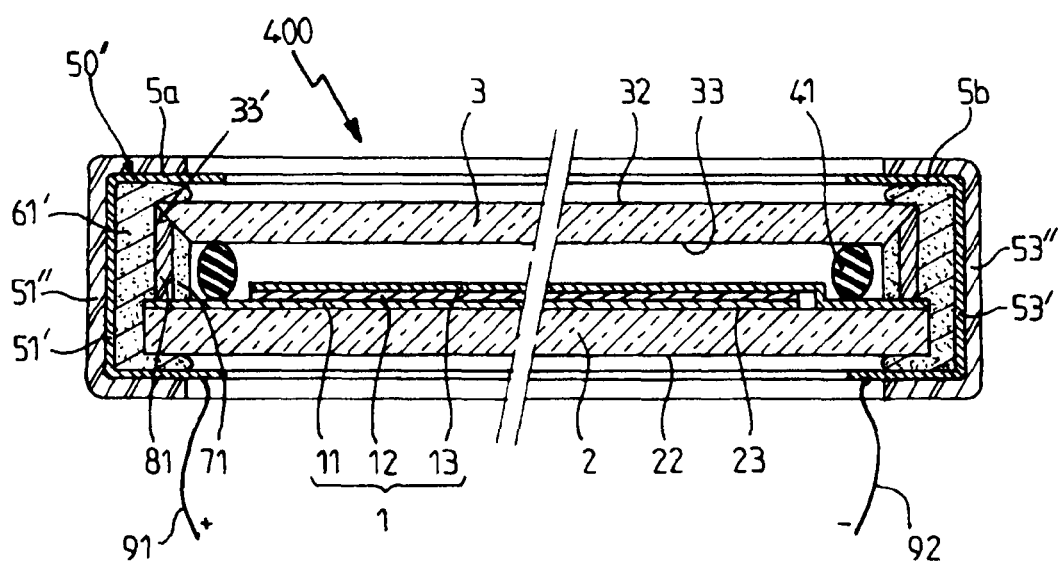

FIG. 4 represents a schematic cross-sectional view of an encapsulated light-emitting device 400 in a fourth embodiment of the invention.

This device 400 differs from the third device 300 by the features presented below, which are mainly linked to the surround.

Each part 5a, 5b of the surround 50' comprises:
- a plastic portion 51", 53" that is optionally reinforced, in particular by fibres;
- a metallic internal protective film 51', 53' of the aluminium or stainless steel strip type for a better impermeability to water vapour, jutting out beyond at least one edge or edges of the plastic portion for the electrical connections with the outside.

During the manufacture, each metallic film 51', 53' is wide enough to be folded over the main outer edges of the substrate and of the cover.

The conductive adhesive 61' is in contact with the portions 56, 56' for electrical connections via the strips. The conductive adhesive 61' may additionally be partially or completely replaced by solders.

Furthermore, if the connecting seal is an epoxy adhesive 41, it is preferred to choose a thick cover with a bevel 33' in order to position another desiccant 71 and another seal 81.

The fourth device 400 may naturally incorporate other features already described for the other embodiments (unbevelled cover of smaller dimensions, glass frit, absence of desiccant and of bordering seal, connecting by lamination, etc.).

Figure 5:
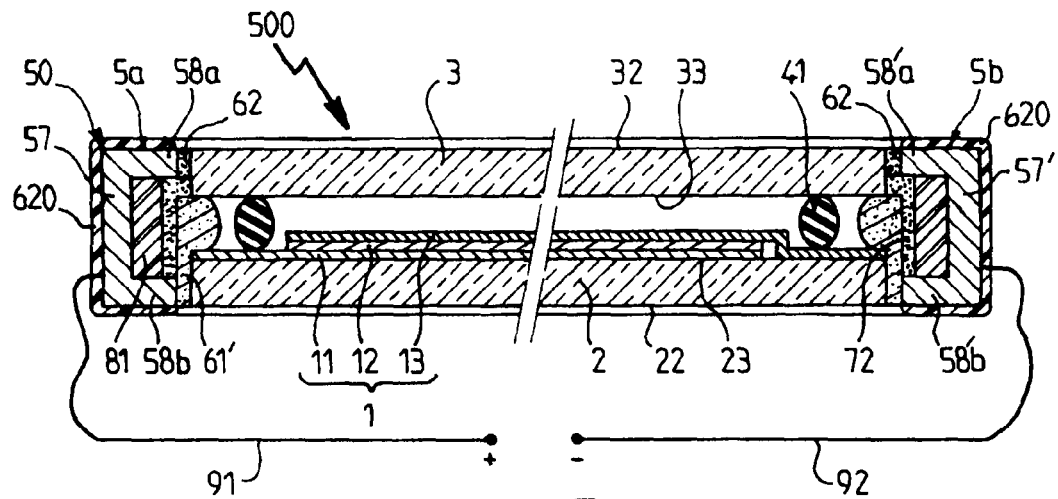

FIG. 5 represents a schematic cross-sectional view of an encapsulated light-emitting device 500 in a fifth embodiment of the invention.

This device 500 differs from the second device 200 by the features presented below, which are mainly linked to the surround and to the layout of the seal 81 and of the desiccant 72.

The substrate 2 and the cover 3 have the same dimensions. The surround 50 is assembled via the side edges of the substrate 2 and of the cover 3 having a thickness, for example, of the order of 5 mm.

The surround 50 is for example made of four parts (two parts are shown) butted together. The cross section of each part 5a, 5b is made of three portions that form a U shape. The side portions 57, 57' are parallel to the side edges. Between the perpendicular portions 58a to 58'b, spaced apart from one another by 2 mm, the desiccant 72, which is for example self-adhesive, and the seal 81 are positioned.

The fifth device may naturally incorporate other features already described for the previous embodiments (connecting by lamination, by glass frit or by glass frame, use of internal connection means, etc.).

Figure 6A:
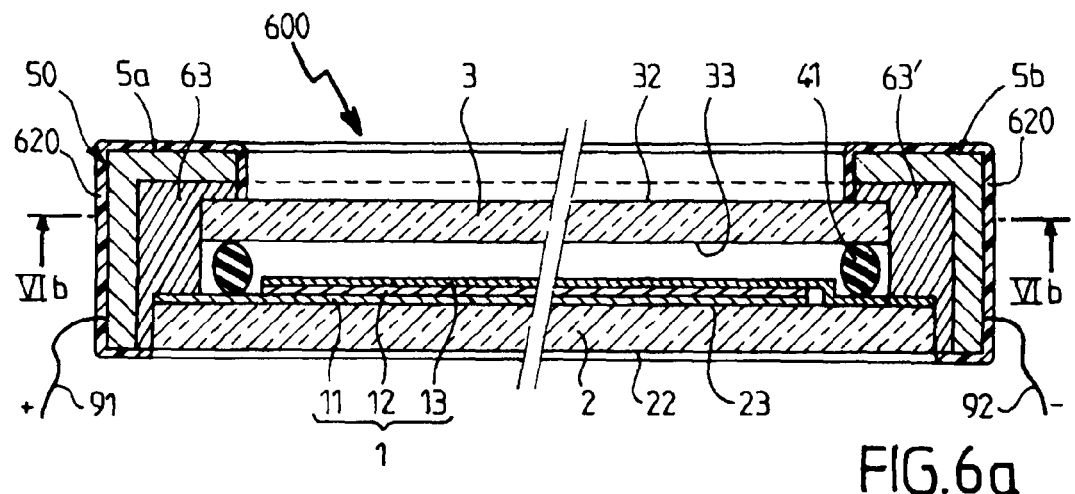
Figures 6B, 6C:
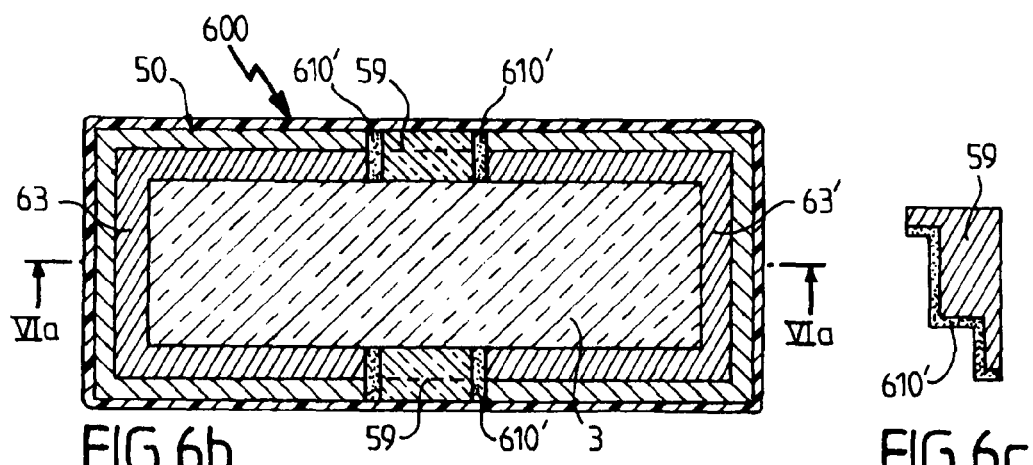

The FIGS. 6a to 6c represent partial schematic cross-sectional views of an encapsulated light-emitting device 600 in a sixth embodiment of the invention.

The device 600 differs from the first device 100 by the features presented below.

The inner walls of the side and covering portions 51 to 54 are soldered to the side edge 31 of the cover and to the inner edges 23 of the substrate. The solders 63, 63' also form the internal electrical connections between the metallic surround 50 and the two electrodes 11, 13. Preferably provision is made for an ultrasonic tinning procedure on the substrate and/or the cover in order to ensure a wettability between the glass and the solder material. The device 600 does not necessarily comprise busbars.

The inner walls of the side and covering portions 51 to 54 are also soldered to the outer edges 33 and to the side edge 21 or, as a variant, are bonded.

The surround 50 makes it possible to shape the solders 63, 63' and to protect the electrodes 11, 13 from possible oxidation.

To avoid short-circuits, the solders and the metal parts are separated by glass spacers 59 (as shown in FIGS. 6b and 6c) bonded to the parts 5a, 5b preferably by a non-conductive hot-melt polymer 610', for example a grey polyisobutylene sold by Teroson under the name Terostat-969G.

As a variant, each part comprises only one side portion, of rectangular cross section.

This device 600 does not comprise either a desiccant or an additional seal and the connecting seal 41 may be a simple acrylate adhesive when the device 600 is produced continuously.

The sixth device 600 may naturally incorporate other features described for the other embodiments (connecting by lamination, by glass frit, bevelled cover of the same dimensions, use of supplementary internal connection means, etc.).

Figure 7A:
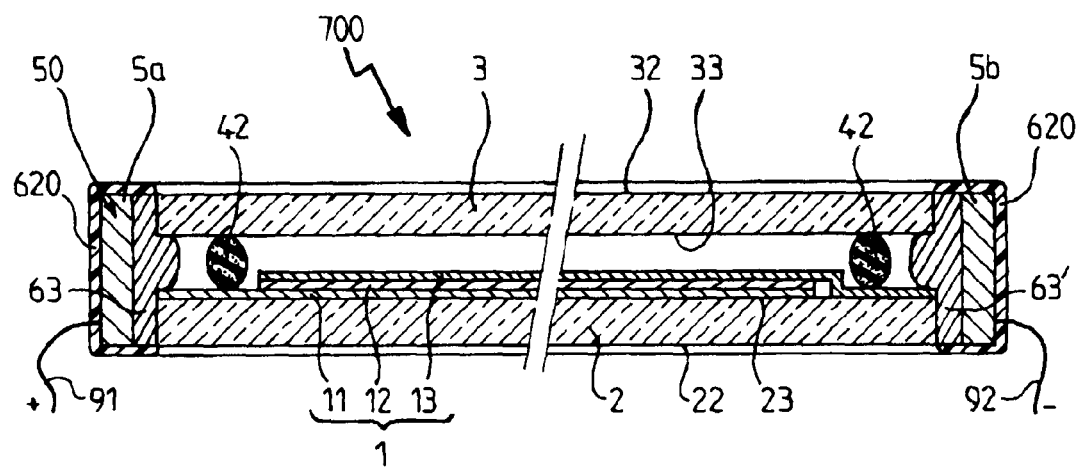

FIG. 7a represents a partial schematic cross-sectional view of an encapsulated light-emitting device 700 in a seventh embodiment of the invention.

This device 700 differs from the sixth device 600 by the features presented below.

The cover and the substrate are of the same dimensions. The surround 50, of straight section, is assembled via two solders 63, 63' isolated from one another by attachment means, such as the polymers described previously.

The connecting seal 42 is a glass frit for better heat resistance.

The seventh device 700 may naturally incorporate other features already described for the other embodiments.

As a variant, the solders 63, 63' may only be present in a plurality of restricted zones in addition to sealing devices. In this configuration, it is then preferred to add silver enamel type 'busbars' or foils to the electrodes 11, 13 for a better distribution of the current.

Figure 7B:
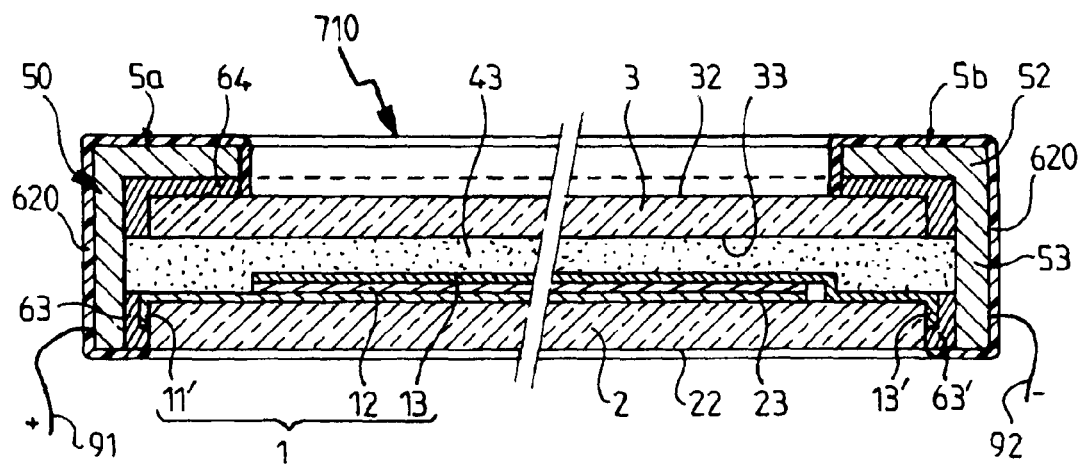
Figure 7C:
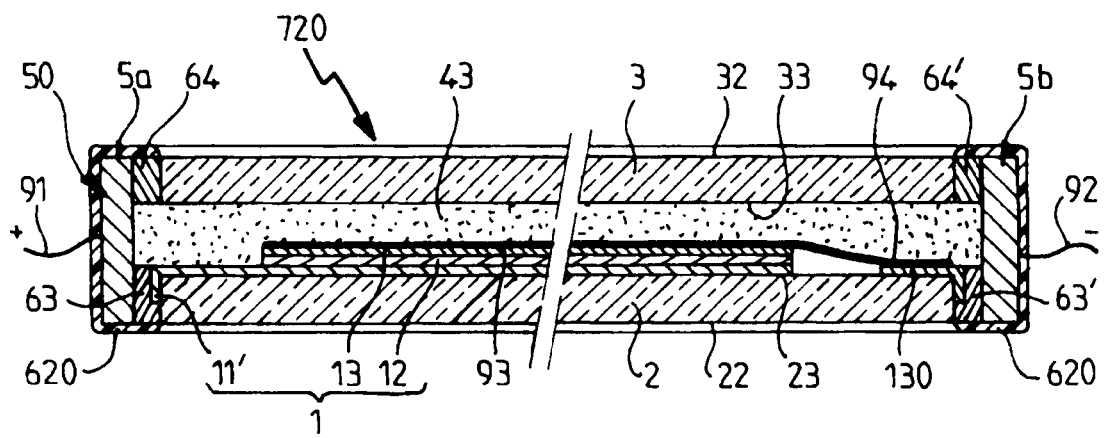
Figure 7D:
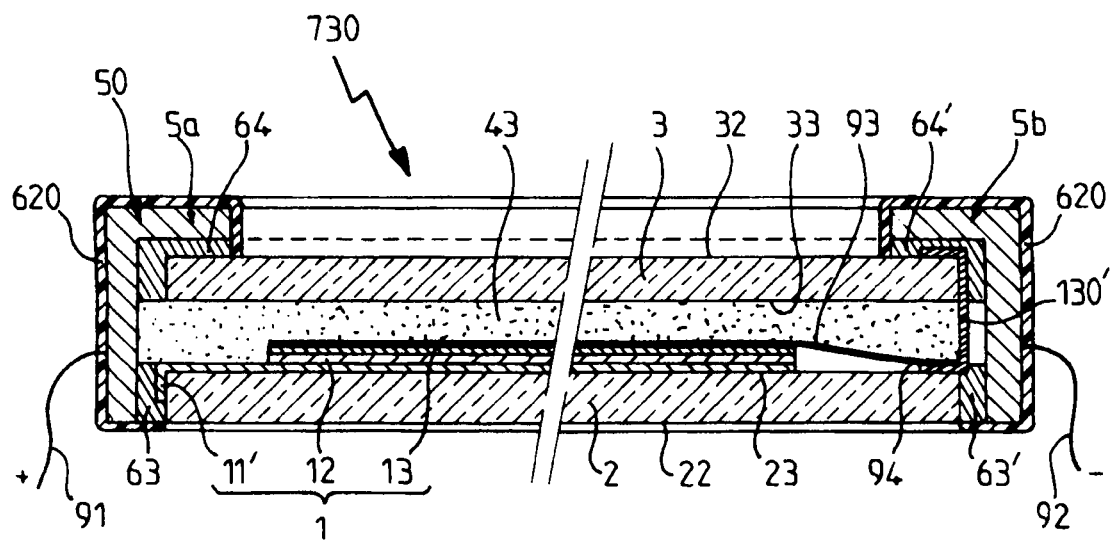

The FIGS. 7*b* to 7*d* represent partial schematic cross-sectional views of encapsulated light-emitting devices 710 to 730 in variants of the seventh embodiment of the invention.

The first variant differs from the seventh device 700 by the features presented below.

Firstly, the device 710 comprises electrodes 11', 13' that overhang over the side edge 21 of the substrate. These arrangements, for example obtained directly by the method of depositing the electrodes, facilitate the electrical connections with the solders 63, 63'.

Next, the device 710 is laminated using a lamination interlayer 43, for example having a thickness of the order of 0.4 mm, for example made of EVA.

Finally, each metal part 5*a*, 5*b* of the surround 50 has an L-shaped cross section.

The second variant 720 differs from the two preceding devices 700 and 710 by the features presented below.

The upper electrode 13 is not extended over the substrate. Applied to the upper electrode 13 (optionally surmounted by one or more other conductive layers) is a network of conductive wires 93 (parallel, grid-shaped, etc.) set into the surface of a sheet 43 of a thermoplastic polymer that acts as a lamination interlayer. Other conductive elements are optionally for joining the electrode for example to a layer that is more conductive than this electrode, and/or to a plurality of conductive strips or wires. Reference can be made to Patent WO-00/57243 for further details on the use of such multi-component electrodes.

The end 94 of the network of wires 93 makes it possible to connect the upper electrode 13 to the solder 63' via a conductive zone preferably a busbar type strip 130 for example made of a conductive enamel or else made of a material deposited by ink jet filled with silver or copper type metal (nano)particles or else a foil with one end preassembled to the interlayer or else a silver epoxy type conductive adhesive. This zone 130, overhangs, at right angles, one of the edges of the side edge 21.

As another variant, the electrode 11' is overhanging two edges (here opposite edges) of the side edge 21. One of the overhanging portions which then comes into contact with the network of wires 94, thus optionally replacing the busbar 130, is insulated.

It is naturally arranged so that neither the network 93 nor the busbar 130 touch the lower electrode 11'.

As a variant, the network of wires 93 is replaced by at least one electroconductive layer and/or by one or more added conductive strips.

The device 720 may naturally incorporate other features already described for the preceding embodiments (assembly via the outer edges of the cover and/or of the substrate, partial or complete replacement of the solder with conductive adhesive, etc.).

Naturally, the solders 63 and 64 or 63' and 64' may be joined.

The third variant 730 differs from the preceding device 720 by the features presented below.

The end 94 of the network of wires 93 makes it possible to connect the upper electrode 13 to one of the solders 64' of the cover 3 via a foil 130'. This foil 130' has:
  a portion both (pre)fastened—for example by softening of the interlayer—against the interlayer 43 and pressed or fastened—for example via solder or conductive adhesive, in particular silver epoxy conductive adhesive or via material deposited by ink jet filled with silver or copper type metal (nano)particles—to the inner edge 23 of the substrate;
  a portion both (pre)fastened against the side edge of the interlayer 43—for example by softening of the interlayer—and pressed or fastened—for example via solder or conductive adhesive, in particular silver epoxy conductive adhesive or else via material deposited by ink jet filled with silver or copper type metal (nano)particles—to the side edge of the cover 31; and
  a portion pressed or fastened—for example via solder or else via material deposited by ink jet filled with silver or copper type metal (nano)particles—against the outer edge 32 of the cover 3.

It is naturally arranged so that neither the network 93 nor the foil 130' touch the lower electrode 11'.

Figure 8A:
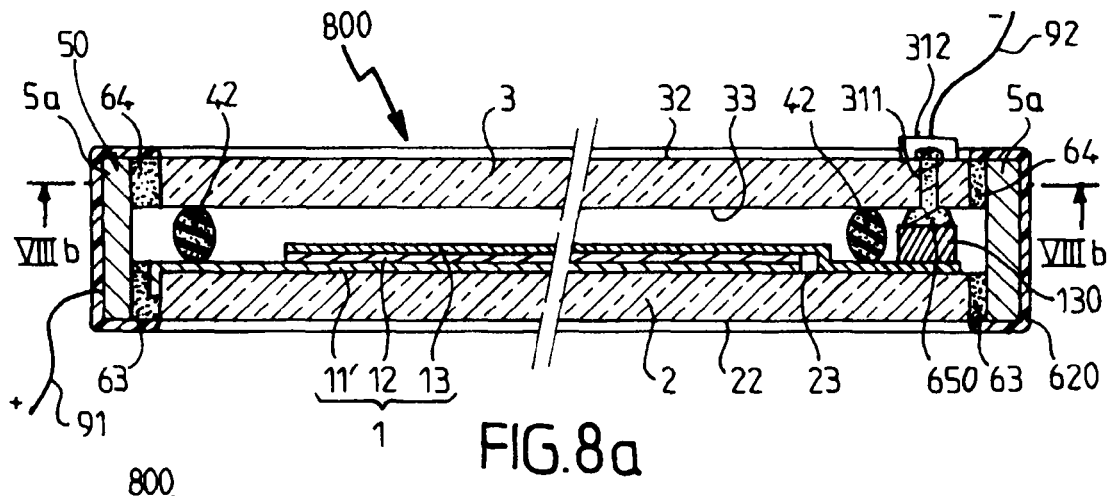
Figure 8B:
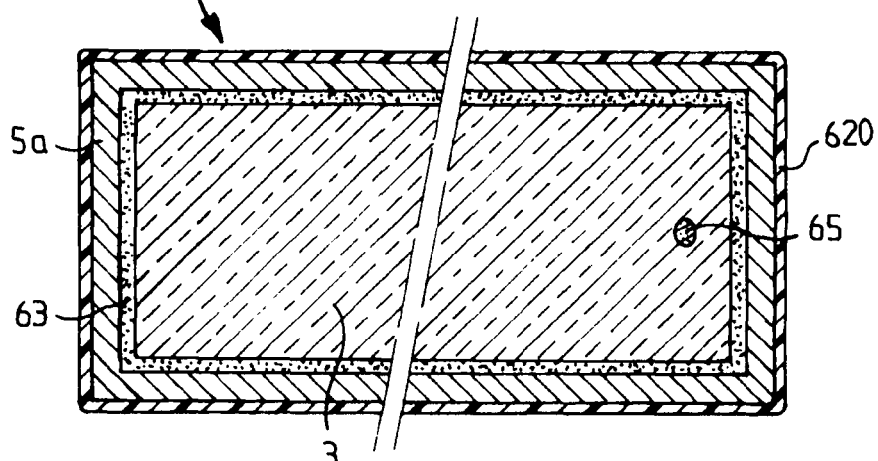

FIGS. 8*a* and 8*b* represent partial schematic cross-sectional and longitudinal-sectional views of an encapsulated light-emitting device 800 in an eighth embodiment of the invention.

This device 800 differs from the device 710 by the features presented below.

The surround 50 is formed from a single metal part 5*a*, of rectangular cross section. The connecting means is a molten glass frit 42.

For the power supply of the upper electrode 13, the cover comprises a through-hole 311 opposite this electrode. Conductive material 650—for example a silver-filled epoxy resin—is injected and forms a conductive column in the respective spaces between the cover and the electrodes 11,13, in contact with a conductive zone, for example a silver enamel busbar strip 130. Preferably, a pellet 312 is soldered via its edges in order to seal the hole 311. The hole is 1 to 10 mm, preferably 3 to 7 mm, wide.

Since the surround 50 is only used for the first electrical connection, it may be made of a single metal part 5*a* (or a part with a metal portion) assembled via one or more solders 63, 64 to the entire circumference (see FIG. 8*b*).

Figure 8C:
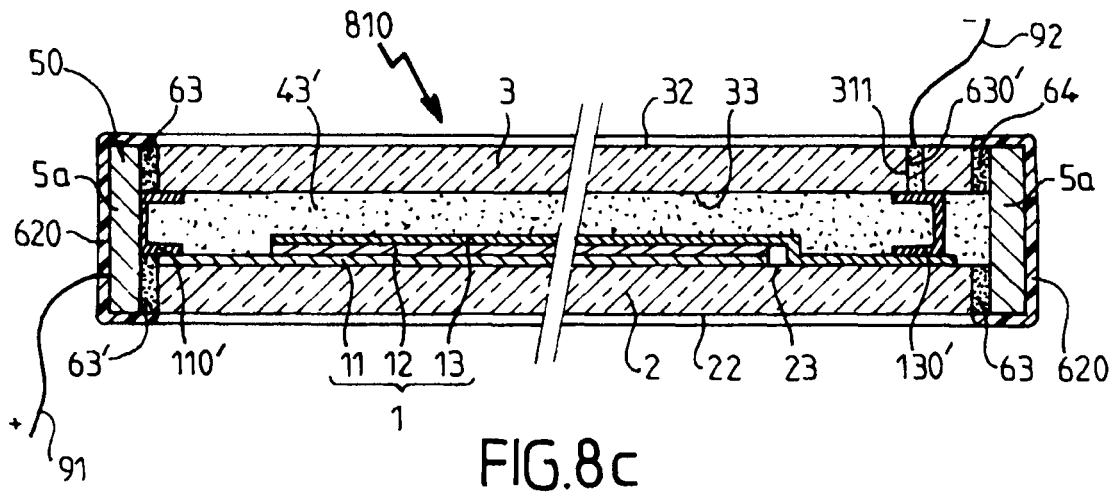

FIG. 8*c* represents a partial schematic cross-sectional view of an encapsulated light-emitting device 810 in one variant of the eighth embodiment of the invention.

This device 810 differs from the preceding device 800 by features presented below that target, in particular, the internal connection means.

The cover and the substrate are connected by a lamination interlayer 43' (43).

For the power supply of the lower electrode 11, it comprises a first U-shaped foil-type strip 110', both (pre)fastened—for example by softening of the interlayer—against the interlayer 43 and pressed or fastened—for example via solder or conductive adhesive—to the inner wall of the part 5*a*, the non-overhanging electrode 11 and the main inner edge of the cover 3.

For the power supply of the upper electrode 13, it comprises a second U-shaped foil-type strip 130', which passes through the interlayer 43, which is cut for this purpose, and is (pre)fastened—for example by softening of the interlayer—against the interlayer 43. This foil 130' is on the one hand pressed or fastened—for example via solder, conductive adhesive, in particular silver epoxy conductive adhesive or via material deposited by ink jet filled with silver or copper type metal (nano)particles—to the inner wall of the part 5a, to the non-overhanging electrode 13, and covers a through-hole 311 filled with metallic material, preferably with solder 630'. The hole is 1 to 10 mm, preferably 3 to 7 mm, wide.

Since the surround 50 is only used for the first electrical connection, it may be made of a single metal part 5a assembled via one or more solders 63, 64 to the entire circumference.

Figure 9:
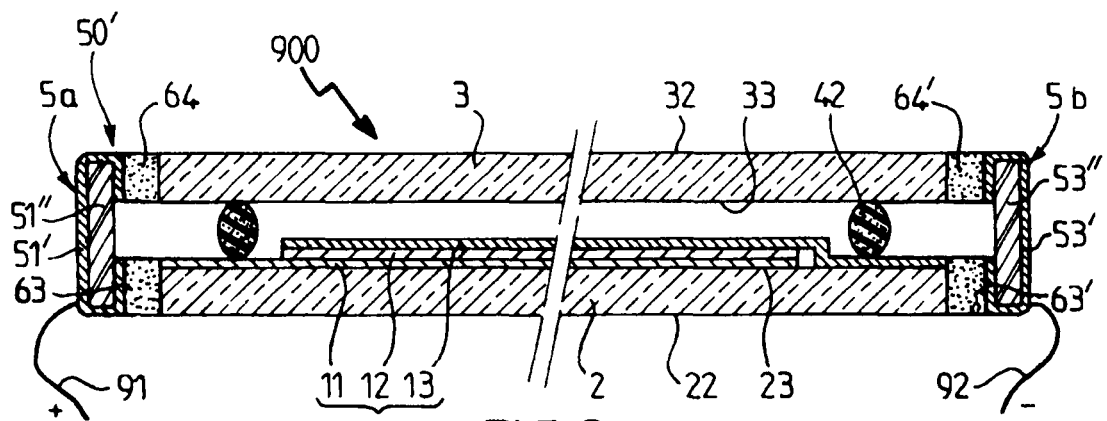

FIG. 9 represents a schematic cross-sectional view of an encapsulated light-emitting device 900 in a ninth embodiment of the invention.

This device 900 differs from the preceding devices by the features presented below.

The surround 50' is formed from two metal-based composite parts.

Each piece 5a, 5b of the surround 50' comprises:
- a portion 51", 53" that is made of plastic and optionally reinforced, in particular by fibres, or that is made of glass;
- a metallic external protective film 51', 53' of the aluminium or stainless steel strip type for a better impermeability to water vapour, the film being folded against the plastic inner face.

The parts 5a, 5b are assembled to the side edges 21, 31 via solders 63 to 64' for the electrical connections with the outside of the surround 50.

Figure 10A:
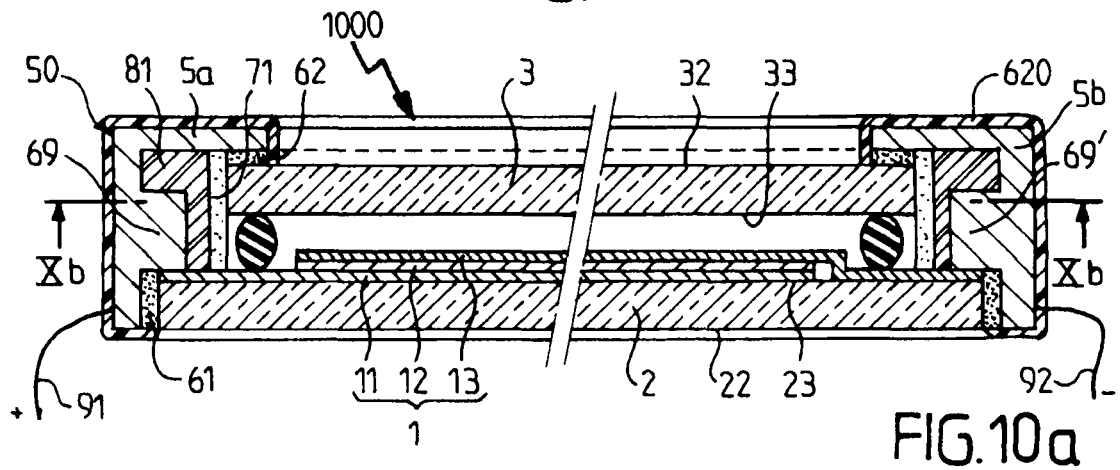
Figure 10B:
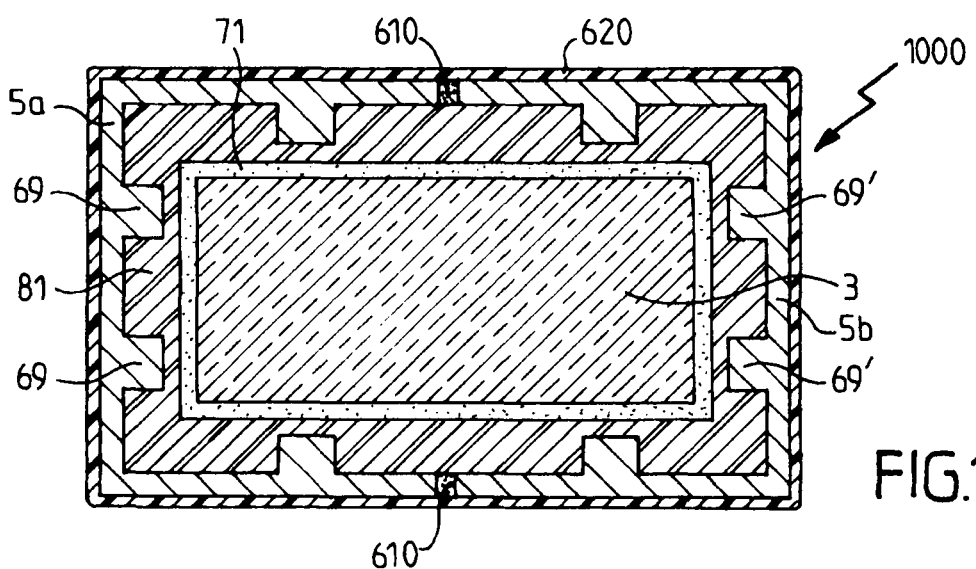

FIG. 10 represents a schematic cross-sectional view of an encapsulated light-emitting device 1000 in a tenth embodiment of the invention.

This device 1000 differs from the second device 200 by the features presented below.

Each side part 51, 53 is equipped on its inner wall with one or more spurs 69, 69' that press on the electrodes 11, 13 in order to make the electrical connections, this by replacement of the assembling conductive adhesive 61', which may be an epoxy adhesive 61.

These spurs may also be used as means of centering and positioning the surround 50.

As a variant, the assembly means are solders separated by a non-conductive grey butyl seal and the means for attaching the parts are also made of a non-conductive grey butyl seal.

Figure 11:
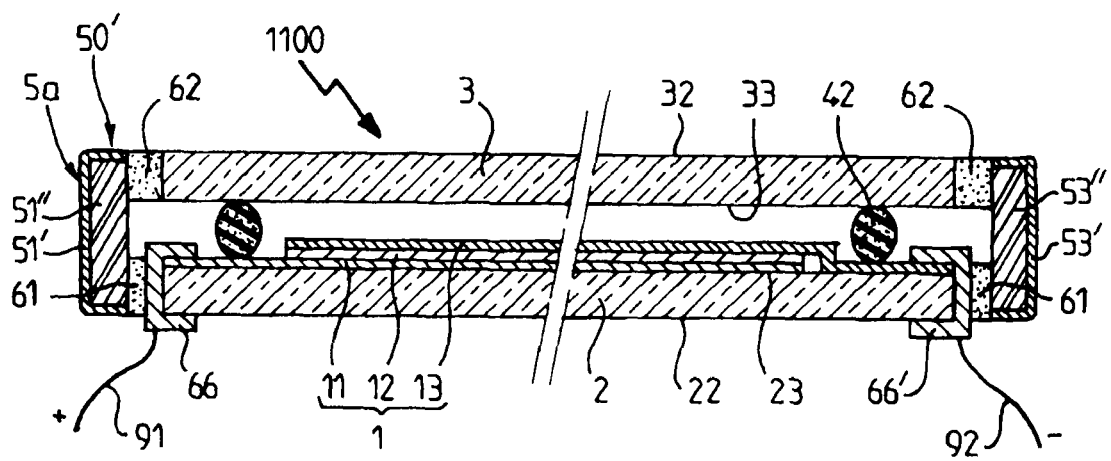

FIG. 11 represents a schematic cross-sectional view of an encapsulated light-emitting device 1100 in an eleventh embodiment of the invention.

This device 1100 differs from the preceding devices by the features presented below.

In substitution for the added-on overhanging conductive strips from the prior art, overhanging conductive layers are chosen. In order to do this, before the assembling of the surround, at the earliest moment after the formation of the electrodes, two opposite edges of the side of the substrate are immersed successively in a bath of tin or silver to form these overhanging layers 66, 66'.

The surround 50' may be dielectric, is made of a single part or of two parts, for example made of plastic 51", 53" with a metallic external protective film 51', 53'.

The assembly means are electrically insulating means of the following type: polymers that are impermeable to water vapour and/or liquid water as mentioned previously (ethylene/vinyl acetate, polyisobutylene, polyamide hot-melt polymers, hot-melt polyurethane polymer).

As a variant, the surround and the means for assembling the surround with the cover and the substrate may form a single element of the metal-based adhesive tape type comprising an adhesive membrane composed, in bulk, of a polyisobutylene-based material (plastic/elastic butyl, butyl rubber), a membrane covered over the outer surface by an untearable film that is resistant to UV radiation and to adverse weather conditions and that is composed of metal, for example aluminium, and of synthetic material(s).

Figure 12:
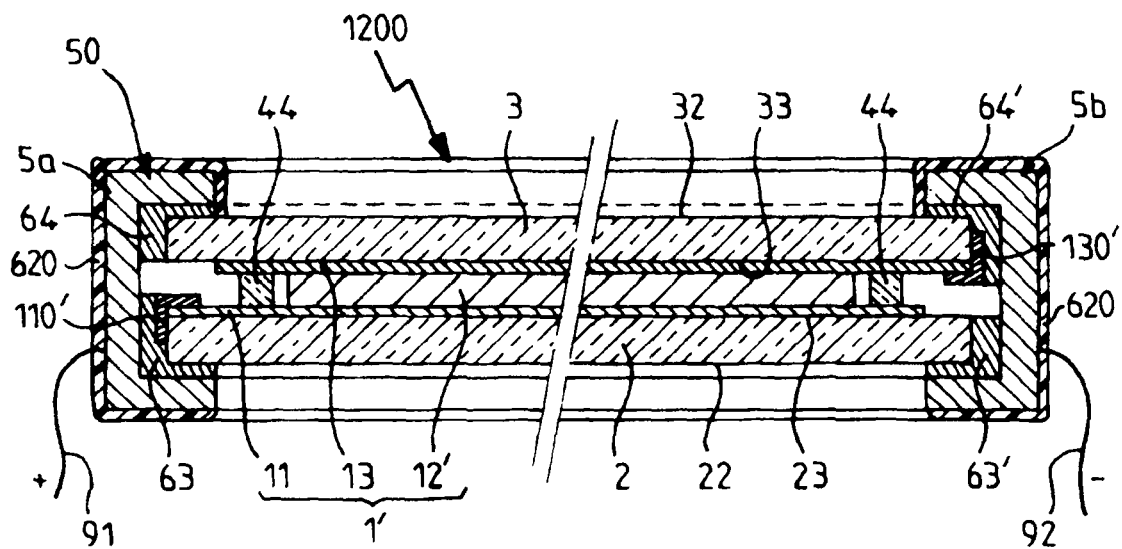

FIG. 12 represents a schematic cross-sectional view of an encapsulated light-emitting device 1200 in a twelfth embodiment of the invention.

This device 1200 differs from the preceding devices by the features presented below.

The system 12' comprises a thick inorganic electroluminescent layer topped by a dielectric layer and by a reflective layer.

The upper electrode 13 is multi-component in that it comprises a reflective layer, such as a thick silver layer, and a TCC or TCO electroconductive layer deposited on the cover 3.

The peripheral means is for example a glass spacer 44 with or without adhesive.

The lower electrode 11 (12) is connected to one of the solders 63 of the substrate via a U-shaped foil-type strip 110'. This foil comprises:
- a portion pressed or even fastened—via conductive bonding or soldering—to the inner edge 33 of the cover;
- a portion pressed or even fastened—via conductive bonding or soldering—to one of the edges of the side 31 of the cover;
- optionally a portion pressed—via conductive bonding or soldering—to the outer edge 32 of the cover 3.

Similarly, the upper electrode 13 is connected to one of the solders 64' of the cover via a U-shaped foil-type strip 130'.

It is arranged so that each electrode 11', 13' does not touch the other of the solders 63', 64.

As a variant, in order to preferably replace one of or the foils, one or both electrode(s) jut(s) out over one edge of the side (of the substrate or of the cover) or use is made of one or some conductive enamel strips, for example screen-printed silver conductive enamel strips, or else a material deposited by ink jet filled with silver or copper type metal (nano)particles or else conductive adhesive or else other conductive layers.

In all the examples, if the device is produced continuously, the means for connecting the cover to the substrate may be an acrylic adhesive, or else a double-sided adhesive.

The devices described previously have many applications.

The light-emitting devices 100 to 1200 may be intended for buildings, thus forming an illuminating façade, a window or an illuminating French window.

The devices 100 to 1200 may be intended for a transport vehicle, such as an illuminating rear window, an illuminating side window or an illuminating motor vehicle sunroof, a rearview mirror, a windscreen section or for any other terrestrial, aquatic or airborne vehicle, in particular a porthole or a cockpit.

The light-emitting devices 100 to 1200 may be intended for urban furniture, such as a bus shelter, a display cabinet, a jewelry display, a shop window, a shelf element, an aquarium wall or a greenhouse.

The light-emitting devices 100 to 1200 may be intended for interior furnishings, a façade of a cabinet, an illuminating paving stone, in particular one made of glass, for wall or floor coverings, an illuminating ceiling tile, for a kitchen dresser or for bathrooms.

The light-emitting devices may be used for a decorative, architectural, signalling or display lighting system.

The invention claimed is:

1. An encapsulated light-emitting device comprising:
   a light-emitting system comprising an electroluminescent active layer positioned on a protective substrate and between two electrodes;
   a protective cover for the electroluminescent layer, attached to the substrate;
   means for sealing against liquid water and/or water vapor;
   a surround over the circumference of the device formed outside of the light-emitting system, outside the protective cover, and outside the means for sealing, so as to surround each of the light-emitting system, the protective cover, and the means for sealing,
   wherein the surround includes at least one metal part or at least one plastic or glass part having a metal portion, the metal part or metal portion used at least for a first electrical connection to one of the electrodes.

2. An encapsulated light-emitting device according to claim 1, wherein the surround is assembled at least partly by the side edge of the substrate and/or by the side edge of the cover.

3. An encapsulated light-emitting device according to claim 1, wherein the surround is assembled by an assembly chosen from one of:
   an epoxy-type adhesive;
   a seal made of a polymer matrix based on thermoplastic or thermosetting polymer(s), or based on elastomer(s), or of mainly saturated hydrocarbon-based elastomer type, or chosen from rubbers based on mono-olefins, or isobutylene or ethylene-propylene, or polyolefins catalysed by metallocene catalysts, or based on ethylene/vinyl acetate (EVA), or based on ethylene/vinyl butyrate (EVB), or based on silicone(s) or on polyurethane(s);
   means that are impermeable at least to water vapor based on hot-melt polymer(s) chosen from at least one of the following polymer families: ethylene/vinyl acetate, polyisobutylene, polyamide, or combined with a watertight polymer, a polysulphide, a polyurethane or a silicone, a polymer material that is impermeable to liquid water and water vapor or a polyurethane hot-melt polymer.

4. An encapsulated light-emitting device according to claim 1, wherein the surround is assembled by an assembly impermeable to liquid water and water vapor, or by one or more solders.

5. An encapsulated light-emitting device according to claim 1, wherein the metal part or the metal portion is assembled, at least partly, by a conductive assembly chosen from at least one of the following assemblies: a solder, a conductive adhesive, an epoxy adhesive filled with silver, a weld.

6. An encapsulated light-emitting device according to claim 1, further comprising an internal electrical connection, for at least the first electrical connection, chosen from at least one of the following electrical connections joined to the surround:
   at least one electroconductive wire;
   at least one electroconductive strip, or metal strip;
   an electroconductive fill material;
   an electroconductive enamel;
   an electroconductive adhesive;
   at least one solder.

7. An encapsulated light-emitting device according to claim 1, further comprising:
   an internal connection that juts out over at least one edge of the side of the substrate or of the cover, and chosen from one of the following: an electroconductive strip of foil type, an electroconductive enamel, an electroconductive thin layer, an electroconductive adhesive, and/or a portion that juts out from one of the electrodes.

8. An encapsulated light-emitting device according to claim 1, wherein one of the electrodes comprises two portions that jut out over two edges, of the side of the substrate or of the cover, one of the portions that juts out being electrically insulated from the other portion that juts out and being used for an electrical connection of the other electrode.

9. An encapsulated light-emitting device according to claim 3, wherein the surround and the assembly assembling the surround with the cover form a single element comprising a membrane composed in bulk of a polyisobutylene-based material, a membrane, or an adhesive membrane, covered over the outer surface by a film composed of metal and of synthetic material(s).

10. An encapsulated light-emitting device according to claim 1, wherein the surround includes at least two parts that are used for a separate electrical connection, the parts are attached and electrically insulated by at least one of the following attachments:
    a seal made of a polymer matrix based on thermoplastic or thermosetting polymer(s), or based on elastomer(s), or of the mainly saturated hydrocarbon-based elastomer type, or chosen from rubbers based on mono-olefins, or isobutylene or ethylene-propylene, or polyolefins catalysed by metallocene catalysts, or based on ethylene/vinyl acetate (EVA), or based on ethylene/vinyl butyrate (EVB), or based on silicone(s) or on polyurethane(s);
    a material based on hot-melt polymer(s) chosen from at least one of the following polymer families: ethylene/vinyl acetate, polyisobutylene, polyamide, or covered by a material that is impermeable to liquid water, or covered by a polysulphide or polyurethane;
    an adhesive that is impermeable to water vapor and liquid water of the glue type or a hot-melt polyurethane.

11. An encapsulated light-emitting device according to claim 1, wherein the surround includes a single part and a second electrical connection produced by a through-hole made in a chosen dielectric cover, the through-hole being filled by a solder and/or another conductive material.

12. An encapsulated light-emitting device according to claim 1, wherein the cover is attached to the substrate by a peripheral mechanism chosen from at least one of the following connectors: an adhesive, an epoxy resin, or a glass frit.

13. An encapsulated light-emitting device according to claim 1, forming a laminated glazing unit, and wherein the cover is attached to the substrate, a lamination interlayer, or a sheet of thermoplastic made of PU, PVB, or made of EVA, or of substantially same dimension as the cover and the substrate, or with a network of electroconductive wires set into an inner surface of the lamination interlayer opposite one electrode, and/or with an electroconductive layer or electroconductive strips on the inner surface.

14. An encapsulated light-emitting device according to claim 13, comprising one of the following electrical connections associated with one or the other of the electrodes:
    an electroconductive strip, or a U-shaped electroconductive strip, of foil type, fastened to at least one edge of the lamination interlayer and in contact with an inner wall of the metallic surround;

an electroconductive strip, or a U-shaped electroconductive strip, of foil type, with a first end joined to the electrode and with a second end in contact with a through-hole filled with metallic material of a dielectric cover and between these ends a portion that passes through the interlayer, which is cut.

15. An encapsulated light-emitting device according to claim 1, further comprising a desiccant or a desiccant powder on the substrate on the outer edge of a covering or a peripheral mechanism used to attach the cover and the substrate.

16. An encapsulated light-emitting device according to claim 1, further comprising between the surround and the cover or a peripheral mechanism, a fill material that is impermeable with respect to water vapor and liquid water, or a solder or a polymer material that is impermeable to water vapor, or that is electrically insulating, or based on hot-melt polymer(s) chosen from at least one of the following polymer families: ethylene/vinyl acetate, polyisobutylene, polyamide or else a seal made of a polymer matrix based on thermoplastic or thermosetting polymer(s), or based on elastomer(s), or of the mainly saturated hydrocarbon-based elastomer type, or chosen from rubbers based on mono-olefins, or isobutylene or ethylene-propylene, or polyolefins catalysed by metallocene catalysts, or based on ethylene/vinyl acetate (EVA), or based on ethylene/vinyl butyrate (EVB), or based on silicone(s) or on polyurethane(s).

17. An encapsulated light-emitting device according to claim 1, wherein the cover is a sheet of flat, bent or toughened glass, and/or with a bevelled side edge and/or with grooved and/or pierced main edges, and/or the main outer edges of the cover and the edges joined to the surround have complementary texturings.

18. An encapsulated light-emitting device according to claim 1, wherein the electroluminescent layer is organic.

19. An encapsulated light-emitting device according to claim 1, wherein the surround is protected against corrosion by a polysulphide or a polyimide.

20. An encapsulated light-emitting device according to claim 1, wherein the system borne by the substrate, and one of the electrodes, as a lower electrode, is associated with the substrate, or is deposited on the substrate, the other of the electrodes, as an upper electrode, is partly associated with the cover, or is deposited on the cover, or the electroluminescent layer is inorganic and thick.

21. An encapsulated light-emitting device according to claim 1, forming a decorative or architectural lighting system, a signaling or display system, and/or is intended for buildings, or to be mounted as double glazing, or a façade, a window or a French window, and/or is intended for a transport vehicle, or a motor vehicle rear window, side window or sunroof, a rearview mirror, or for a terrestrial, aquatic or airborne vehicle, or a porthole or a cockpit and/or is intended for urban furniture or for interior furnishings, or as a bus shelter, a display cabinet, a jewelry display, a shop window, a shelf element, an aquarium wall, a greenhouse, an illuminating mirror, a façade of a cabinet, a paving stone, or an illuminating paving stone, for wall or floor or ceiling coverings.

* * * * *

UNITED STATES PATENT AND TRADEMARK OFFICE
CERTIFICATE OF CORRECTION

PATENT NO.         : 8,395,319 B2                                    Page 1 of 1
APPLICATION NO.    : 12/375217
DATED              : March 12, 2013
INVENTOR(S)        : Svetoslav Tchakarov et al.

It is certified that error appears in the above-identified patent and that said Letters Patent is hereby corrected as shown below:

On the title page, Item (54) lines 1-2, and in the specification, column 1, lines 1-2, the Title of Invention is incorrect. Item (54) and Column 1 lines 1-2, should read:

-- ENCAPSULATED LIGHT-EMITTING DEVICE --

Signed and Sealed this
Twenty-eighth Day of May, 2013

Teresa Stanek Rea
*Acting Director of the United States Patent and Trademark Office*